(12) United States Patent
Tsuda

(10) Patent No.: US 8,264,011 B2
(45) Date of Patent: Sep. 11, 2012

(54) SEMICONDUCTOR DEVICE

(75) Inventor: Nobuhiro Tsuda, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/248,965

(22) Filed: Sep. 29, 2011

(65) Prior Publication Data

US 2012/0018839 A1    Jan. 26, 2012

Related U.S. Application Data

(62) Division of application No. 12/178,204, filed on Jul. 23, 2008, now Pat. No. 8,063,415.

(30) Foreign Application Priority Data

Jul. 25, 2007  (JP) ................................. 2007-193580
May 26, 2008  (JP) ................................. 2008-137063

(51) Int. Cl.
  *H01L 23/52* (2006.01)
(52) U.S. Cl. ........ 257/208; 257/207; 257/211; 257/773; 257/E23.142; 257/E23.168
(58) Field of Classification Search .............. 257/206, 257/207, 208, 211, 773, E21.575, E23.142, 257/E23.153, E23.168; 438/622
See application file for complete search history.

(56) References Cited

U.S. PATENT DOCUMENTS

| | | | |
|---|---|---|---|
| 5,898,194 A | 4/1999 | Gheewala et al. | |
| 5,923,060 A | 7/1999 | Gheewala et al. | |
| 6,091,090 A | 7/2000 | Gheewala et al. | |
| 6,448,631 B2 * | 9/2002 | Gandhi et al. | 257/635 |
| 6,617,621 B1 | 9/2003 | Gheewala et al. | |
| 6,864,518 B1 | 3/2005 | Longway et al. | |
| 6,974,978 B1 | 12/2005 | Possley | |
| 7,129,562 B1 | 10/2006 | Gheewala et al. | |
| 7,219,324 B1 | 5/2007 | Sherlekar et al. | |
| 7,240,314 B1 | 7/2007 | Leung | |
| 7,265,396 B2 | 9/2007 | Maeno et al. | |
| 7,332,780 B2 * | 2/2008 | Matsuda et al. | 257/369 |
| 7,755,110 B2 | 7/2010 | Gliese et al. | |
| 2004/0228066 A1 | 11/2004 | Sakurabayashi et al. | |
| 2005/0127406 A1 * | 6/2005 | Tokunaga et al. | 257/204 |
| 2009/0166883 A1 | 7/2009 | Nishimura | |

FOREIGN PATENT DOCUMENTS

JP    2000-223575    8/2000

* cited by examiner

*Primary Examiner* — Matthew Landau
*Assistant Examiner* — Joseph C Nicely
(74) *Attorney, Agent, or Firm* — McDermott Will & Emery LLP

(57) ABSTRACT

CMOS inverters are included in a standard cell. Power supply lines are electrically connected to CMOS inverters, and include lower layer interconnects and upper layer interconnect. Lower layer interconnects extend along a boundary of standard cells adjacent to each other and on the boundary. Upper layer interconnects are positioned more inside in standard cell than lower layer interconnects, as viewed from a plane. CMOS inverters are electrically connected through upper layer interconnects to lower layer interconnects. Thus, a semiconductor device is obtained that can achieve both higher speeds and higher integration.

5 Claims, 22 Drawing Sheets

FIG.18
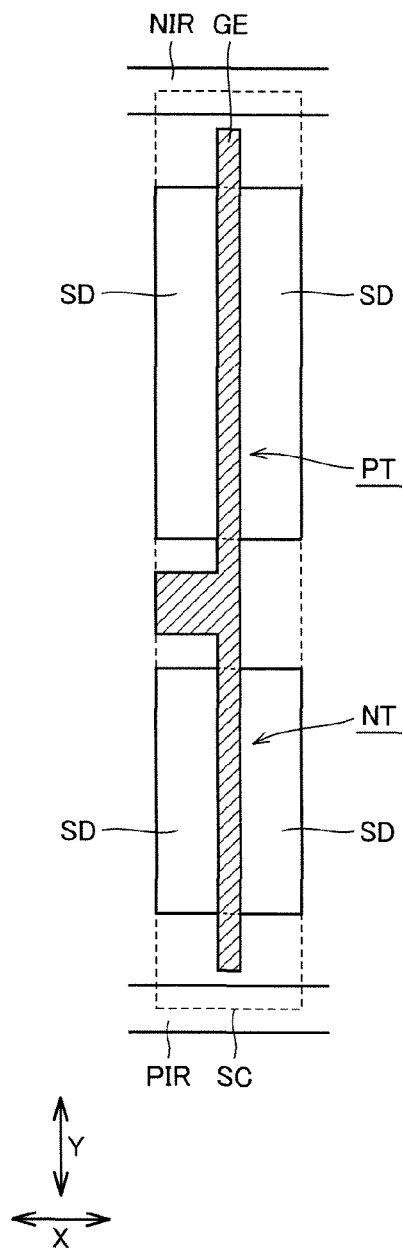
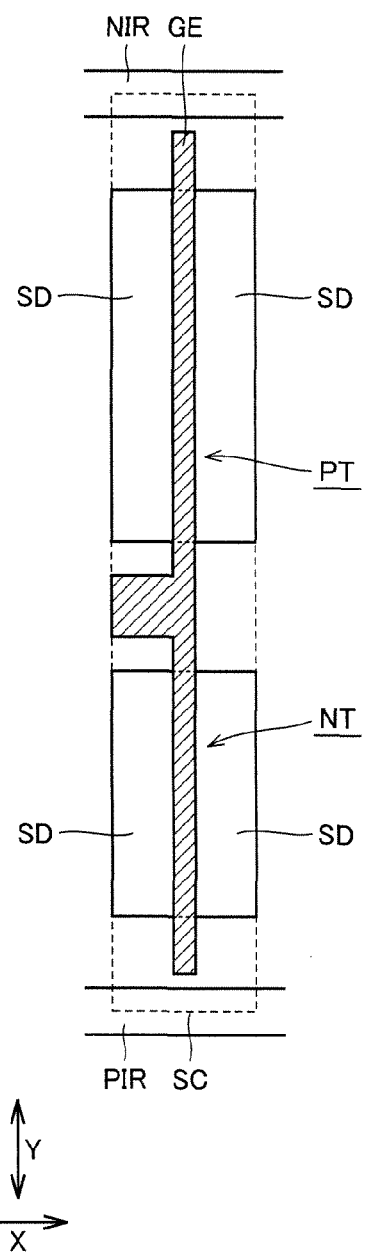

FIG.24
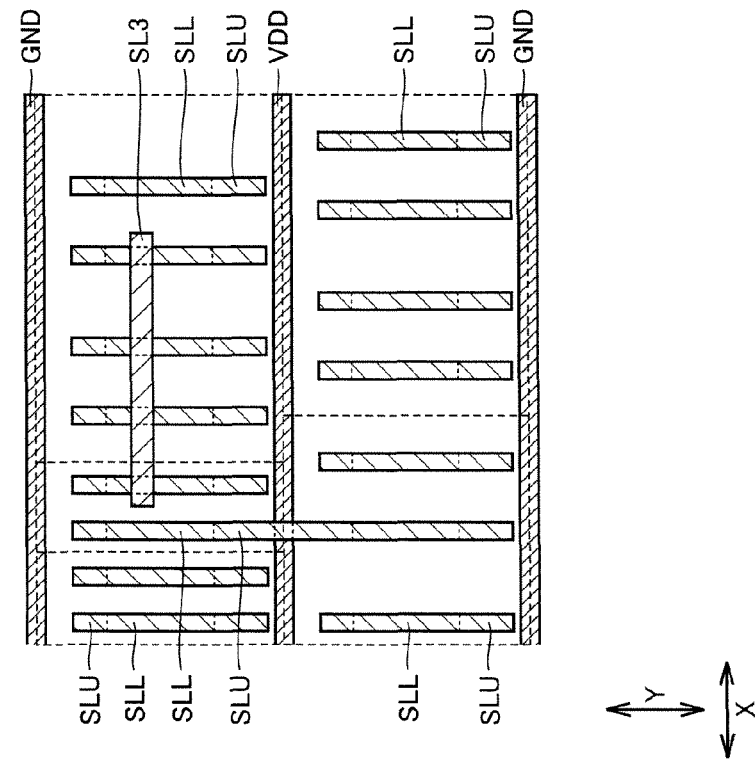
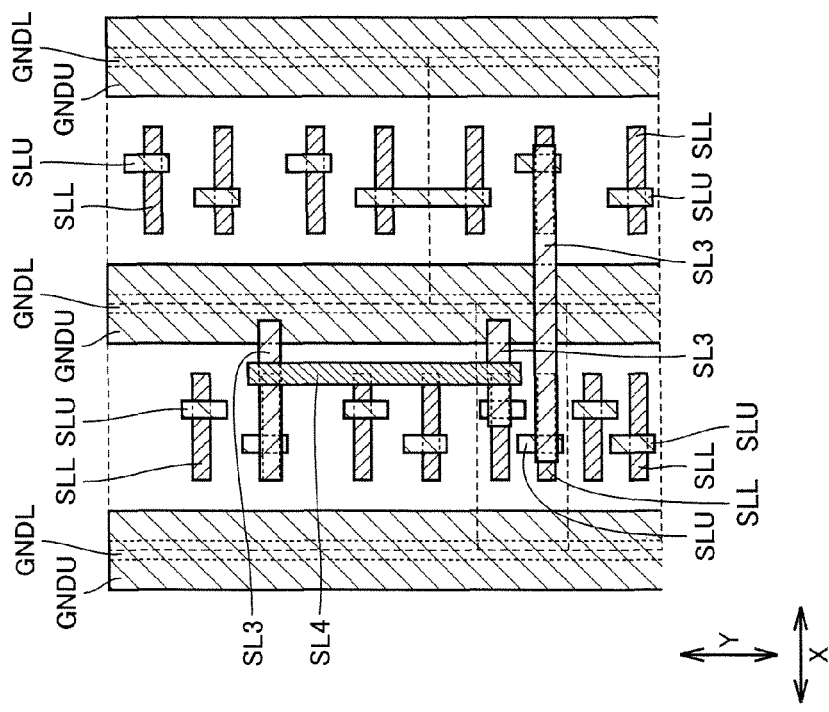

SEMICONDUCTOR DEVICE

RELATED APPLICATIONS

This application is a Divisional of U.S. application Ser. No. 12/178,204, filed on Jul. 23, 2008 now U.S. Pat. No. 8,063,415, claiming priority of Japanese Patent Application Nos. 2007-193580, filed on Jul. 25, 2007 and 2008-137063, filed on May 26, 2008, the entire contents of each of which are hereby incorporated by reference.

BACKGROUND OF THE INVENTION

1. Field of the Invention

The present invention relates to semiconductor devices, and particularly to semiconductor devices having a plurality of aligned standard cells.

2. Description of the Background Art

In recent years, layout design using a standard cell library is generally performed in system on chip (SOC) because of increasing scale of circuit integration. As the advanced functions and performances of SOC are achieved, the demand for higher integration and higher speeds of the standard cell library increases. On the other hand, an increase in consumption current involved in such achievement of high speeds makes an increasing problem of causing characteristic degradation due to power supply noise such as IR-Drop (i.e., assuming that when current I flows through a path and the resistance value of the path is R, a potential difference represented as I×R is generated at both ends of the path).

Conventionally, there is a configuration of forming, e.g., a complementary metal oxide semiconductor (CMOS) inverter as a function element in a standard cell of a standard cell library. In this configuration, a p-channel MOS transistor (hereinafter referred to as a "pMOS transistor") is formed on the surface of an n-type well region, and an n-channel MOS transistor (hereinafter referred to as an "nMOS transistor") is formed on the surface of a p-type well region. Connected to each of these pMOS transistor and nMOS transistor are power supply lines (VDD interconnect and GND interconnect). Each of these power supply lines is connected to a substrate to fix the substrate potential, and is provided commonly in a function element in each standard cell.

Since consumption current of a standard cell increases with increasing speeds of a standard cell library, current flowing through a power supply line also increases. Current of a plurality of standard cells is flowed into a power supply line common to the standard cells. This causes an increase of a value of current that flows through the power supply line, and therefore an effect of IR-Drop needs to be considered. IR-Drop of a power supply line is correlated with the resistance value of the power supply line; the smaller the resistance value is, the smaller the effect of IR-Drop becomes. Therefore, measures to increase the line width of a power supply line have been taken.

On the other hand, with achievement of higher integration of a standard cell library, two CMOS transistors having different drain nodes are sometimes arranged in one standard cell. In this case, a method has been implemented that four transistors are arranged in a row in a vertical direction, as viewed from a plane, to achieve higher integration of a standard cell. With this method, there has been a tendency that the number of interconnects of connecting transistors and the number of interconnects of connecting transistors and power supply lines are increased to make the interconnect layout complicated.

A conventional layout of arranging a plurality of standard cells is disclosed in, e.g., Japanese Patent Laying-Open No. 2000-223575. This patent document discloses that first layer power supply lines (3VDD1 and 3VSS1) and third layer power supply lines (3VDD3 and 3VSS3) in parallel thereto are provided and a signal line (3S2) passes through a second layer, so that the first layer power supply lines are reinforced by the third layer power supply lines without imposing restrictions on the arrangement of the second layer.

However, it has been difficult for such a conventional configuration as mentioned above to include both a configuration of widening power supply lines for higher speeds and a configuration of arranging a plurality of transistors in the vertical direction for higher integration so as to realize a standard cell with higher integration and higher speeds. The reason is that widening of power supply lines makes it difficult to secure intervals between interconnects of connecting drains of a pMOS transistor and an nMOS transistor constituting an inverter and an interconnect portion of connecting the power supply line to the transistor.

SUMMARY OF THE INVENTION

The present invention is made in view of the above problems, an object thereof is to provide a semiconductor device that can achieve both higher speeds and higher integration.

A semiconductor device according to an embodiment of the invention is one having a plurality of aligned standard cells, and includes a function element and a power supply line. The function element is included in the standard cell. The power supply line is electrically connected to the function element and includes a lower layer interconnect and an upper layer interconnect. The lower layer interconnect has a portion extending along a boundary of the standard cells that are adjacent to each other and on the boundary. The upper layer interconnect has a portion positioned more inside in the standard cell than the lower layer interconnect, as viewed from a plane. The function element is electrically connected to the lower layer interconnect through the upper layer interconnect.

With a semiconductor device according to an embodiment of the invention, the power supply line is separated into the lower layer interconnect and the upper layer interconnect. This causes an increased number of electric current paths as compared to a case of the power supply line being a single layer, and therefore allows higher speeds to be achieved. The number of electric current paths can be increased without increasing the line width of the power supply line, thus allowing higher integration to be achieved.

The lower layer interconnect extends along the boundary of the standard cell, and therefore standard cells adjacent to each other can share the lower layer interconnect. As a result of this, there is no need for these power supply lines to be formed independently in each of the standard cells adjacent to each other, thereby allowing higher integration to be achieved.

Further, the function element is connected through the upper layer interconnect to the lower layer interconnect, and therefore the lower layer interconnect positioned at the boundary of the standard cell needs not to extend to a central portion of the standard cell where the function element is positioned. This creates an open space in a portion leading to the central portion of the standard cell where the lower layer interconnect should have extended, and therefore other interconnects can be arranged in the open space, allowing higher integration to be achieved.

From the above, a semiconductor device can be obtained that can achieve both higher speeds and higher integration.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 18 is a schematic plan view showing the plan layout configuration of a high-speed cell formed in a logic region where high integration has priority (hereinafter referred to as a "high-integration priority logic region") HIL and a high-integration cell formed in a logic region where high performance has priority (hereinafter referred to as a "high-performance priority logic region") HRL, and shows diffusion regions and isolation regions formed in a semiconductor substrate, and polysilicon layers such as gate electrode layers formed on the semiconductor substrate;

FIG. 24 is a plan view schematically showing the configuration of a device having both a high-speed cell and a high-integration cell as a semiconductor device in a sixth embodiment of the invention.

DESCRIPTION OF THE PREFERRED EMBODIMENTS

Figure 1:
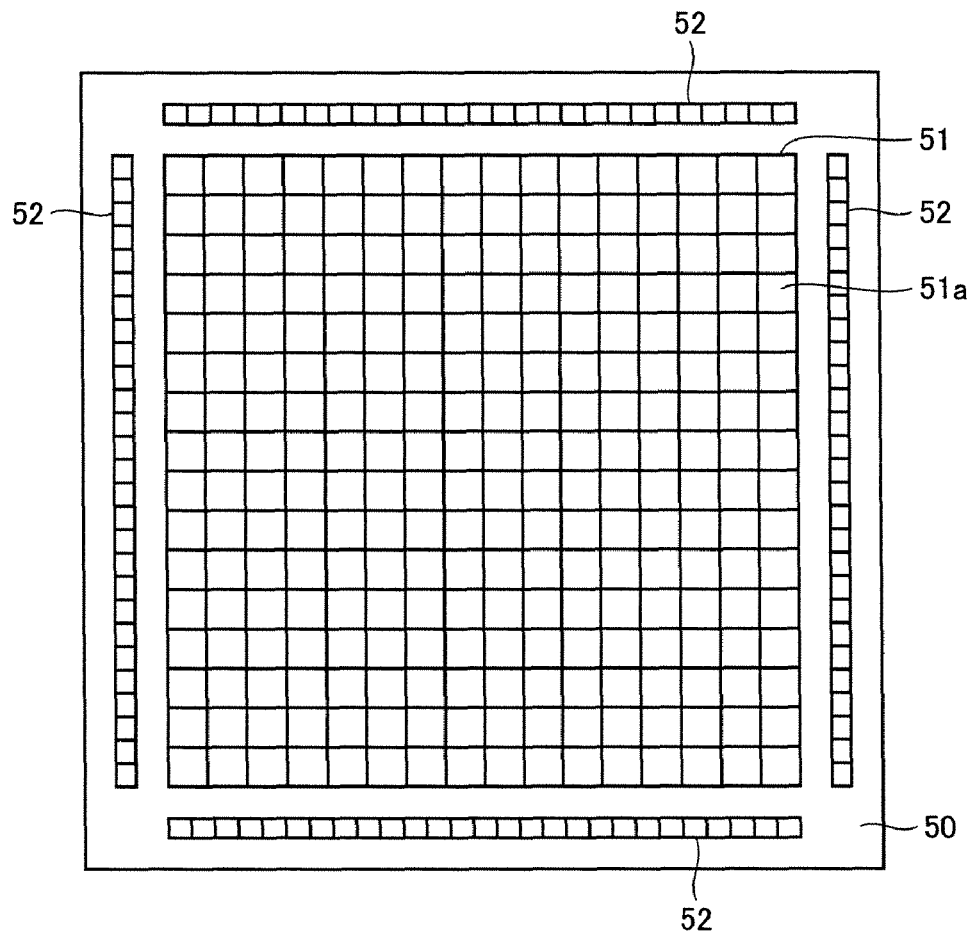
FIG. 1 is a plan view schematically showing the configuration of a semiconductor device in a first embodiment of the invention.

Embodiments of the invention will be described below referring to the drawings.

(First Embodiment)

With reference to FIG. 1, a semiconductor device (e.g., a semiconductor chip) 50 mainly includes on the surface of semiconductor device 50 a standard cell region 51, input/output (I/O) cell regions 52 arranged around standard cell region 51, and pads (not shown) for use in input and output to and from the outside.

Standard cell region 51 has a plurality of standard cells 51a arranged in a matrix. In an SOC using a standard cell library, formed in this standard cell region 51 are a central processing unit (CPU), a random access memory (RAM), a first-in first-out (FIFO), a small computer system interface (SCSI), a sea of gate (SOG), etc.

Figure 2:
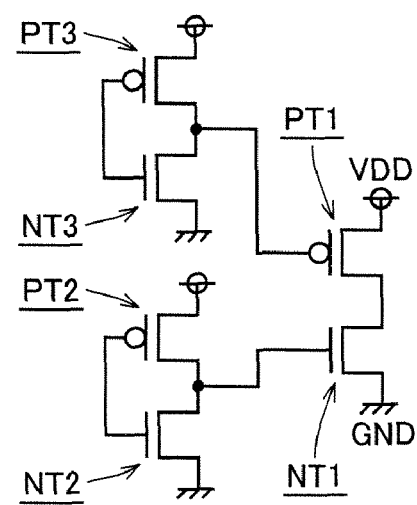
FIG. 2 is a circuit diagram showing an example of the circuit configuration of a function element formed in one standard cell 51a shown in FIG. 1.

With reference to FIG. 2, a circuit of a function element formed in standard cell 51a is, e.g., a partial circuit of a buffer for tri state, and has an output stage and a driver. The output stage is made, e.g., of a CMOS inverter including a pMOS transistor PT1 and an nMOS transistor NT1. The driver is composed, e.g., of a CMOS inverter including a pMOS transistor PT2 and an nMOS transistor NT2 and a CMOS inverter including a pMOS transistor PT3 and an nMOS transistor NT3.

Output of the CMOS inverter including pMOS transistor PT2 and nMOS transistor NT2 is input to nMOS transistor NT1 of the output stage. Output of the CMOS inverter including pMOS transistor PT3 and nMOS transistor NT3 is input to pMOS transistor PT1 of the output stage.

In this circuit, when "High" is input to the two CMOS inverters of the driver, "High" is output from the CMOS inverter of the output stage. When "Low" is input to the two CMOS inverters of the driver, "Low" is output from the CMOS inverter of the output stage. When "Low" is input to the CMOS inverter including pMOS transistor PT3 and nMOS transistor NT3 and "High" is input to the CMOS inverter including pMOS transistor PT2 and nMOS transistor NT2, output of the CMOS inverter of the output stage is in a floating state, i.e., so-called "high-impedance".

Figure 3:
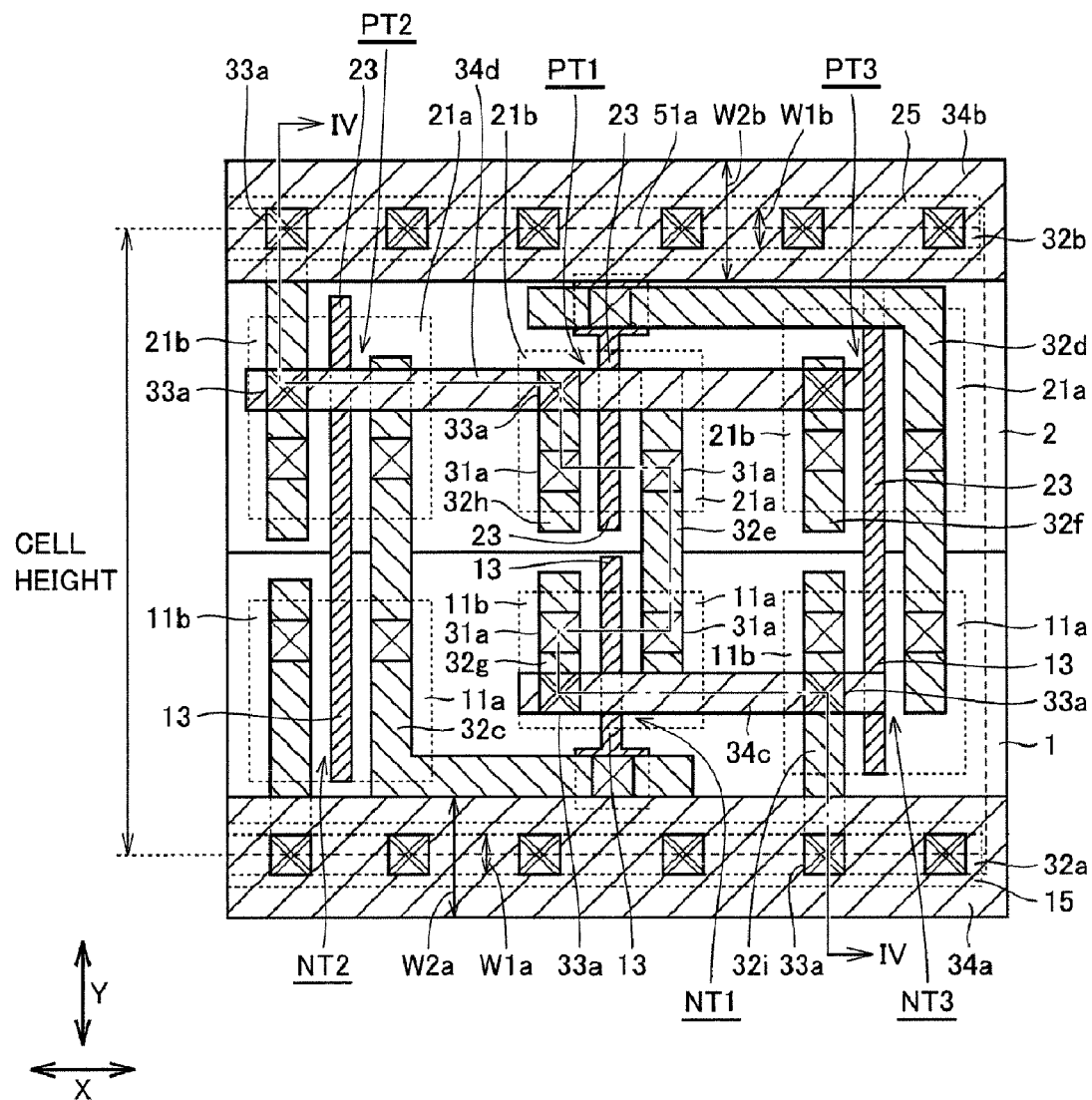
FIG. 3 is a plan view schematically showing the configuration of one standard cell in which a circuit shown in FIG. 2 is formed.
Figure 4:
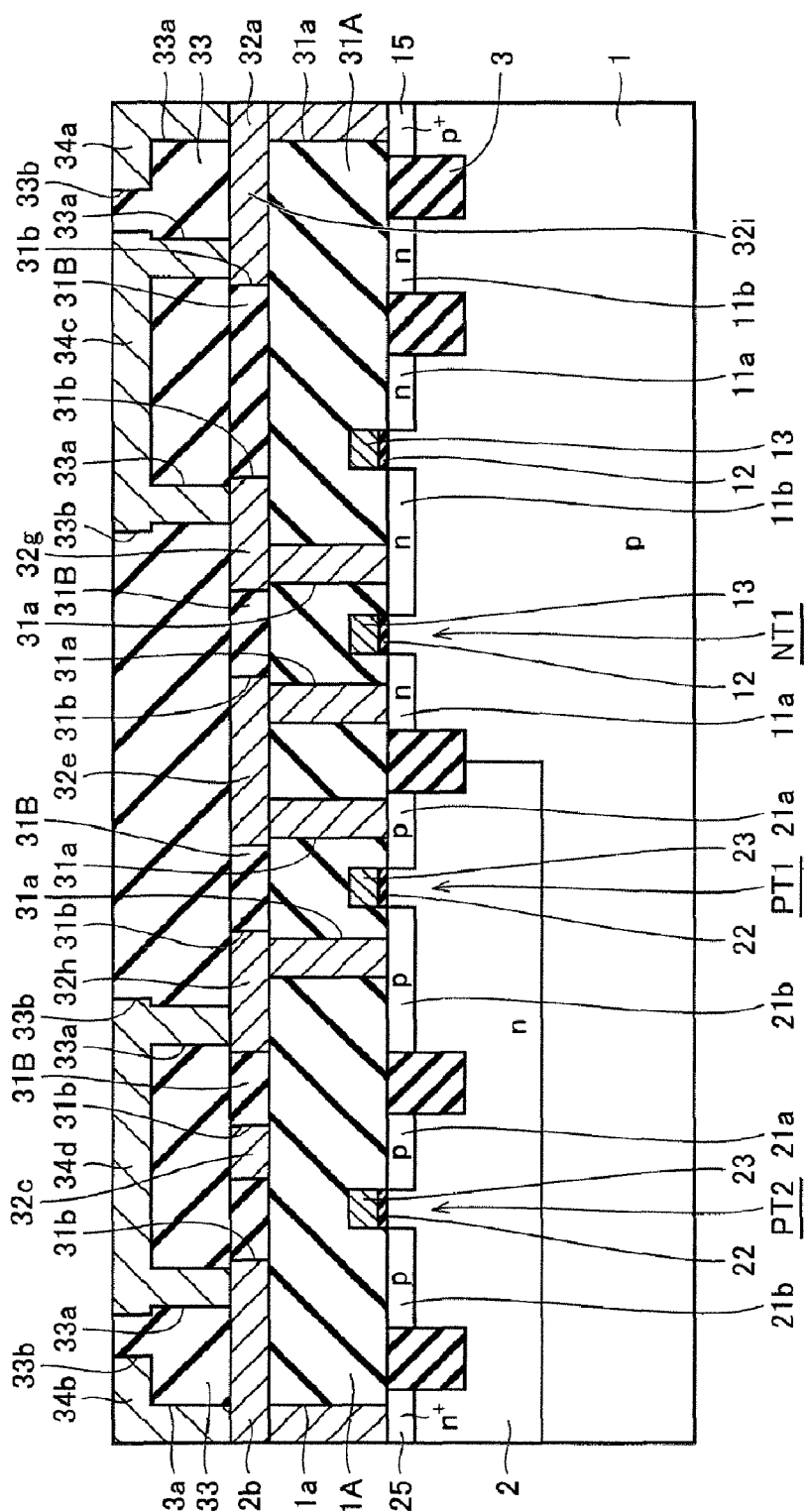
FIG. 4 is a schematic sectional view taken along the line IV-IV of FIG. 3.

With reference to FIGS. 3 and 4, a p-type well region 1 is formed on the surface of a semiconductor substrate and an n-type well region 2 is selectively formed on the surface of p-type well region 1. Formed on the surface in p-type well region 1 are nMOS transistors NT1, NT2 and NT3. Formed on the surface in n-type well region 2 are pMOS transistors PT1, PT2 and PT3.

Among one (boundary on the lower side in a Y direction in FIG. 3) of the boundaries in a vertical direction (Y direction in FIG. 3) of standard cell 51a, a p+ region 15 is formed in such a manner as to extend in a lateral direction (X direction in FIG. 3) on the surface in p-type well region 1. Along the other (boundary on the upper side in the Y direction in FIG. 3) of the boundaries in the vertical direction (Y direction in FIG. 3) of standard cell 51a, an n+ region 25 is formed in such a manner as to extend in the lateral direction (X direction in FIG. 3) on the surface in n-type well region 2.

In order to electrically isolate each of a plurality of MOS transistor formation regions, p+ region 15 and n+ region 25, element isolation regions 3 made e.g., of shallow trench isolation (STI) are formed on the surface of the semiconductor substrate. This STI is composed of a trench provided on the surface of the semiconductor substrate and an insulating filler with which the trench is filled.

Each of nMOS transistors NT1, NT2 and NT3 includes a drain region 11a and a source region 11b, a gate insulating layer 12 and a gate electrode layer 13. Drain region 11a and source region 11b are made of n-type impurity regions, and are formed at a distance from each other on the surface of p-type well region 1. Gate electrode layer 13 is formed on a region sandwiched by drain region 11a and source region 11b with gate insulating layer 12 interposed therebetween.

Each of pMOS transistors PT1, PT2 and PT3 includes a drain region 21a and a source region 21b, a gate insulating layer 22 and a gate electrode layer 23. Drain region 21a and source region 21b are made of p-type impurity regions, and are formed at a distance from each other on the surface of n-type well region 2. Gate electrode layer 23 is formed on a region sandwiched by drain region 21a and source region 21b with gate insulating layer 22 interposed therebetween.

Gate electrode layer 13 of nMOS transistor NT2 and gate electrode layer 23 of pMOS transistor PT2 are made of a common conductive layer and electrically connected to each other. Gate electrode layer 13 of nMOS transistor NT3 and gate electrode layer 23 of pMOS transistor PT3 are made of a common conductive layer and electrically connected to each other.

Interlayer insulating layers 31A and 31B are formed and laminated on the surface of the semiconductor substrate so as to cover each of MOS transistors NT1 to NT3 and PT1 to PT3. Interlayer insulating layer 31A is made, e.g., of a tetra-ethyl-ortho-sihcate (TEOS) oxide film, and interlayer insulating layer 31B is made, e.g., of SiOc and methyl silses-quioxane (MSQ).

Formed in interlayer insulating layer 31B are wiring grooves 31b reaching interlayer insulating layer 31A from the top surface of interlayer insulating layer 31B, and formed interlayer insulating layer 31A are contact holes 31a reaching the semiconductor substrate from the bottoms of wiring grooves 31b. Inside each of foregoing wiring grooves 31b, buried interconnect layers 32a to 32h made, e.g., of a CuAl alloy (with an Al content of, e.g., about 0.1 to 1.0%) are formed. Inside each of foregoing contact holes 31a, a buried plug layer made of tungsten (W) is formed.

Note that formed on the side surfaces and the bottom surfaces of contact holes 31a are barrier metal layers (not shown). The barrier metal layers are positioned between the foregoing plug layers and interlayer insulating layers 31A and between the foregoing plug layers and the semiconductor substrate. The barrier metal layers have a laminated structure, e.g., of titanium (Ti) and titanium nitride (TiN).

Formed on the side surfaces and the bottom surfaces of wiring grooves 31b are barrier metal layers (not shown). The barrier metal layers are positioned between foregoing interconnect layers 32a to 32h and interlayer insulating layers 31B and between foregoing interconnect layers 32a to 32h and interlayer insulating layers 31A. The barrier metal layers are made, e.g., of tantalum (Ta).

Formed between the interlayer insulating layers 31A and the interlayer insulating layers 31B are etching stopper layers (not shown) made e.g., of SiCN.

With interconnect layer 32e, drain region 11a of nMOS transistor NT1 and drain region 21a of pMOS transistor PT1 are electrically connected to each other. With interconnect layer 32c, drain region 11a of nMOS transistor NT2 and drain region 21a of pMOS transistor PT2 are electrically connected to each other, and are electrically connected to gate electrode layer 13 of nMOS transistor NT1. With interconnect layer 32d, drain region 11a of nMOS transistor NT3 and drain region 21a of pMOS transistor PT3 are electrically connected to each other, and are electrically connected to gate electrode layer 23 of pMOS transistor PT1. These interconnect layers 32c and 32d are signal lines that transmit signals from the driver to the output stage.

Interconnect layer 32a extends along one (boundary on the lower side in the Y direction in FIG. 3) of the boundaries in the vertical direction of standard cell 51a in such a manner as to extend in the lateral direction (X direction in FIG. 3). Interconnect layer 32b extends along the other (boundary on the upper side in the Y direction in FIG. 3) of the boundaries in the vertical direction of standard cell 51a in such a manner as to extend in the lateral direction (X direction in FIG. 3) on the boundary. Power supply potentials (VDD and GND) can be applied to interconnect layers 32a and 32b extending along and on the boundaries of these standard cells, and interconnect layers 32a and 32b correspond to lower layer interconnects of the power supply line.

Specifically, the GND potential can be applied to interconnect layer 32a, and the VDD potential can be applied to interconnect layer 32b.

Interconnect layer 32a is electrically connected to p+ region 15 to fix the potential of p-type well region 1. Interconnect layer 32a has a portion that is separate from a portion linearly extending along one (boundary on the lower side in the Y direction in FIG. 3) of the boundaries in the vertical direction (Y direction in FIG. 3) and extends above source region 11b of each of nMOS transistors NT2 and NT3, and interconnect layer 32a is electrically connected to source region 11b in the portion.

Interconnect layer 32b is electrically connected to n+ region 25 to fix the potential of n-type well region 2. Interconnect layer 32b has a portion that is separate from a portion linearly extending along the other (boundary on the upper side in the Y direction in FIG. 3) of the boundaries in the vertical direction (Y direction in FIG. 3) and extends above source region 21b of pMOS transistor PT2, and interconnect layer 32b is electrically connected to source region 21b in the portion.

Interconnect layers 32g, 32h and 32f are electrically connected to source region 11b of nMOS transistor NT1, source region 21b of pMOS transistor PT1 and source region 21b of pMOS transistor PT3, respectively.

Note that connection of each of interconnect layers 32a to 32h with an impurity region formed on the surface of the semiconductor substrate is performed through the plug layer in contact hole 31 formed in interlayer insulating layer 31A.

An interlayer insulating layer 33 made, e.g., of SiOC and MSQ is formed on interlayer insulating layer 31B so as to cover interconnect layers 32a to 32h. Wiring grooves 33b are formed in the upper surface of interlayer insulating layer 33, and via grooves 33a each reaching each of the underlying interconnect layers from the bottom of each of wiring grooves 33b are formed. In order that interconnect layers 34a to 34d be buried inside via grooves 33a and wiring grooves 33b, interconnect layers 34a to 34d made, e.g., of a CuAl alloy (with an Al content of, e.g., about 0.1 to 1.0%) are formed.

Formed on the side surfaces and the bottom surfaces of via grooves 33a and wiring grooves 33b are barrier metal layers (not shown). The barrier metal layers are positioned between each of interconnect layers 34a to 34d and interlayer insulating layer 33, between each of via grooves 33a and interlayer insulating layer 33, and between each of via grooves 33a and the underlying interconnect layer. The barrier metal layers have a laminated structure, e.g., of tantalum (Ta) and tantalum nitride (TaN).

Formed under interlayer insulating layer 33 are etching stopper layers (not shown) made e.g., of SiCN.

With interconnect layer 34c, source region 11b (interconnect layer 32g) of nMOS transistor NT1 and source region 11b of nMOS transistor NT3 are electrically connected to each other, and are electrically connected to interconnect layer 32a to which the GND potential can be applied. With interconnect layer 34d, source region 21b (interconnect layer 32h) of pMOS transistor PT1, source region 21b (interconnect layer 32f) of pMOS transistor PT3, and source region 21b of pMOS transistor PT2 are electrically connected to one another, and are electrically connected to interconnect layer 32b to which the VDD potential can be applied.

Interconnect layer 34c, in a plan view shown in FIG. 3, is arranged more inside (central side) in standard cell 51a than lower layer interconnect 32a of the power supply line. Interconnect layer 34d, in a plan view shown in FIG. 3, is arranged more inside (central side) in standard cell 51a than lower layer interconnect 32b of the power supply line.

Interconnect layer 34a extends along one (boundary on the lower side in the Y direction in FIG. 3) of the boundaries in the vertical direction (Y direction in FIG. 3) of standard cell 51a in such a manner as to extend in the lateral direction (X direction in FIG. 3) on the boundary. Interconnect layer 34b extends along the other (boundary on the upper side in the Y direction in FIG. 3) of the boundaries in the vertical direction (Y direction in FIG. 3) of standard cell 51a in such a manner as to extend in the lateral direction (X direction in FIG. 3) on the boundary. Interconnect layer 34a is connected to interconnect layer 32a extending in parallel to the underlying layer of interconnect layer 34a, and interconnect layer 34b is connected to interconnect layer 32b extending in parallel to the underlying layer of interconnect layer 34b.

Interconnect layer 34a has a line width W2a larger than a line width W1a of interconnect layer 32a extending in parallel to the underlying layer of interconnect layer 34a. Interconnect layer 34b has a line width W2b larger than a line width W1b of interconnect layer 32b extending in parallel to the underlying layer of interconnect layer 34b.

Thus, all interconnect layers 34a, 34b, 34c and 34d in this standard cell 51a are at a power supply potential of either of VDD and GND, and therefore are upper layer interconnects of the power supply line.

Note that electrical connection of each of interconnect layers 34a to 34d with interconnect layers 32a, 32b and 32e to 32i is performed through a portion to be buried in via groove 33a of each of interconnect layers 34a to 34d.

As described above, source region 11b of CMOS transistor NT1 is electrically connected through upper layer interconnect 34c of the power supply line at the GND potential to lower layer interconnect 32a of the power supply line at the GND potential. Source region 21b of each of pMOS transistors PT1 and PT3 is electrically connected through upper layer interconnect 34d of the power supply line at the VDD potential to lower layer interconnect 32b of the power supply line at the VDD potential.

Signal line 32c, in a plan view shown in FIG. 3, is arranged to be positioned between a connection portion (via hole 33a) of upper layer interconnect 34c of the power supply line with interconnect layer 32g and a portion linearly extending along the boundary of standard cell 51a of lower layer interconnect 32a. Signal line 32d, in a plan view shown in FIG. 3, is arranged to be positioned between a connection portion (via hole 33a) of upper layer interconnect 34d of the power supply line with interconnect layer 32h and a portion linearly extending along the boundary of standard cell 51a of lower layer interconnect 32b.

According to the present embodiment, the power supply line at the GND potential is separated into lower layer interconnect 32a and upper layer interconnect 34a, and the power supply line at the VDD potential is separated into lower layer interconnect 32b and upper layer interconnect 34b. Thus, this case has an increased number of electric current paths as compared to a case of the power supply line being a single layer, and therefore allows higher speeds to be achieved. The number of electric current paths can be increased without increasing the line width of the power supply line, thus allowing higher integration to be achieved.

Upper layer interconnects 34a and 34b have line widths W2a and W2b larger than line widths W1a and W1b of lower layer interconnects 32a and 32b, thus allowing the resistance value of the power supply line to be reduced.

Lower layer interconnects 32a and 32b have line widths W1a and W1b smaller than line widths W2a and W2b of upper layer interconnects 34a and 34b, thus increasing an open space for arranging interconnects accordingly. Thus, it becomes easy to arrange other interconnects (e.g., signal lines 32c and 32d) in the same layer as that of the lower layer interconnects, improving the freedom of the planar layout of other interconnects.

Each of lower layer interconnects 32a and 32b extends along the boundaries of standard cell 51a. Accordingly, standard cells 51a adjacent to each other can share lower layer interconnects 32a and 32b. As a result of this, there is no need for lower layer interconnects 32a and 32b to be formed independently in each of standard cells 51a adjacent to each other, thereby allowing higher integration to be achieved.

Each of upper layer interconnects 34a and 34b extends along the boundaries of standard cell 51a. As a result of this, in a similar manner as described above, there is no need for upper layer interconnects 34a and 34b to be formed independently in each of standard cells 51a adjacent to each other, thereby allowing higher integration to be achieved.

Further, source region 11b of nMOS transistor NT1 is electrically connected through upper layer interconnect 34c of the power supply line at the GND potential to lower layer interconnect 32a of the power supply line at the GND potential. Source region 21b of each of pMOS transistors PT1 and PT3 is electrically connected through upper layer interconnect 34d of the power supply line at the VDD potential to lower layer interconnect 32b of the power supply line at the VDD potential. Therefore, each of lower layer interconnects 32a and 32b positioned at the boundaries of standard cells 51a needs not to extend to a central portion of standard cell 51a where a transistor is positioned. This creates an open space in a portion leading to the central portion of standard cell 51a where each of lower layer interconnects 32a and 32b should have extended, and therefore other interconnects such as signal lines 32c and 32d can be arranged in the open space, allowing higher integration to be achieved.

As a result of arranging signal lines 32c and 32d in this way, signal line 32c, in a plan view shown in FIG. 3, can be arranged to be positioned between a connection portion of upper layer interconnect 34c of the power supply line with interconnect layer 32g and a portion linearly extending along the boundary of standard cell 51d of lower layer interconnect 32a. Signal line 32d, in a plan view shown in FIG. 3, can be arranged to be positioned between a connection portion of upper layer interconnect 34d of the power supply line with interconnect layer 32h and a portion linearly extending along the boundary of standard cell 51a of lower layer interconnect 32b.

From the above, a semiconductor device can be obtained that can achieve both higher speeds and higher integration.
(Second Embodiment)

Figure 5:
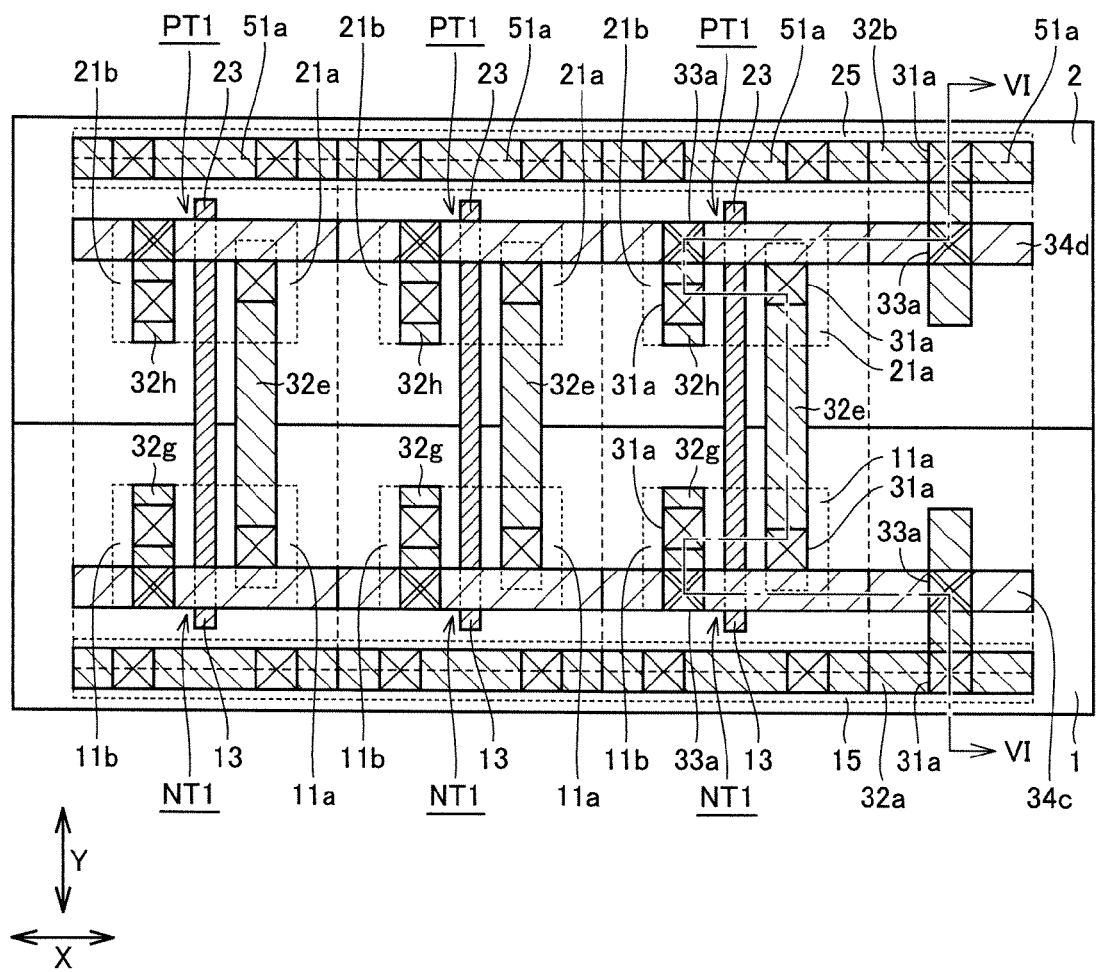
FIG. 5 is a plan view schematically showing a state where a plurality of standard cells of a semiconductor device in a second embodiment of the invention are aligned.
Figure 6:
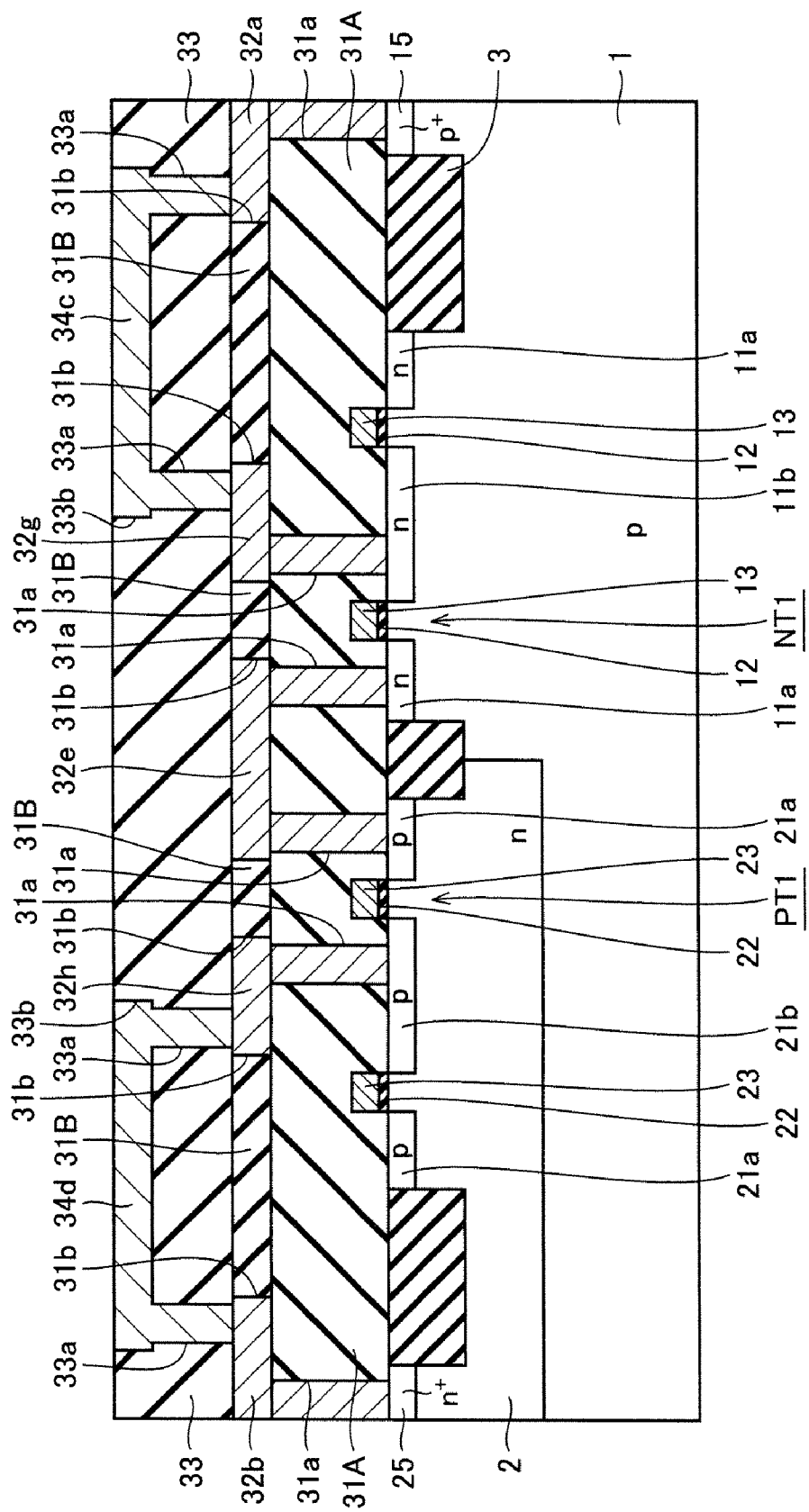
FIG. 6 is a schematic sectional view along the line VI-VI of FIG. 5.

With reference to FIGS. 5 and 6, in the present embodiment, a configuration will be described in which a CMOS inverter including nMOS transistor NT1 and pMOS transistor PT1 is formed in each of a plurality of standard cells 51a.

P-type well region 1 is formed on the surface of a semiconductor substrate and n-type well region 2 is selectively formed on the surface in p-type well region 1. Formed on the surface in p-type well region 1 is nMOS transistor NT1. Formed on the surface in n-type well region 2 is pMOS transistor PT1.

In such a manner as to extend in the lateral direction (X direction in FIG. 5) along one (boundary on the lower side in the Y direction in FIG. 5) of the boundaries in the vertical direction (Y direction in FIG. 5) of standard cell 51a, p+ region 15 is formed on the surface in p-type well region 1. In such a manner as to extend in the lateral direction (X direction in FIG. 5) along the other (boundary on the upper side in the Y direction in FIG. 5) of the boundaries in the vertical direction (Y direction in FIG. 5) of standard cell 51a, n+ region 25 is formed on the surface in n-type well region 2.

In order to electrically separate each of a plurality of MOS transistor formation regions, p+ region 15 and n+ region 25, element isolation region 3 made e.g., of STI is formed on the surface of the semiconductor substrate. This STI is composed of a trench provided on the surface of the semiconductor substrate and an insulating filler with which the trench is filled.

NMOS transistor NT1 includes drain region 11a and source region 11b, gate insulating layer 12 and gate electrode layer 13. Drain region 11a and source region 11b are made of n-type impurity regions, and are formed at a distance from each other on the surface of p-type well region 1. Gate electrode layer 13 is formed on a region sandwiched by drain region 11a and source region 11b with gate insulating layer 12 interposed therebetween.

PMOS transistor PT1 includes drain region 21a and source region 21b, gate insulating layer 22 and gate electrode layer 23. Drain region 21a and source region 21b are made of p-type impurity regions, and are formed at a distance from each other on the surface of n-type well region 2. Gate electrode layer 23 is formed on a region sandwiched by drain region 21a and source region 21b with gate insulating layer 22 interposed therebetween.

Gate electrode layer 13 of nMOS transistor NT2 and gate electrode layer 23 of pMOS transistor PT2 are made of a common conductive layer and electrically connected to each other.

Interlayer insulating layers 31A and 31B are formed and laminated on the surface of the semiconductor substrate so as to cover MOS transistors NT1 and PT1. The interlayer insulating layer 31A is made, e.g., of a TEOS oxide film, and interlayer insulating layer 31B is made, e.g., of SiOC and MSQ. Formed in interlayer insulating layer 31B are wiring grooves 31b reaching interlayer insulating layer 31A from the top surface of interlayer insulating layer 31B, and formed in interlayer insulating layer 31A are contact holes 31a reaching the semiconductor substrate from the bottoms of wiring grooves 31b. Inside each of foregoing wiring grooves 31b, buried interconnect layers 32a, 32b, 32e, 32g and 32h made, e.g., of a CuAl alloy (with an Al content of, e.g., about 0.1 to 1.0%) are formed. Inside each of foregoing contact holes 31a, an buried plug layer made of tungsten (W) is formed.

Note that formed on the side surfaces and the bottom surfaces of contact holes 31a are barrier metal layers (not shown). The barrier metal layers are positioned between the foregoing plug layers and interlayer insulating layers 31A and between the foregoing plug layers and the semiconductor substrate. The barrier metal layers have a laminated structure, e.g., of titanium (Ti) and titanium nitride (TiN).

Formed on the side surfaces and the bottom surfaces of wiring grooves 31b are barrier metal layers (not shown). The barrier metal layers are positioned between each of foregoing interconnect layers 32a, 32b, 32e, 32g and 32h and interlayer insulating layer 31B, between each of foregoing interconnect layers 32a, 32b, 32e, 32g and 32h and the foregoing plug layer, and between each of foregoing interconnect layers 32a, 32b, 32e, 32g and 32h and interlayer insulating layers 31A. The barrier metal layers are made, e.g., of tantalum (Ta).

Formed between interlayer insulating layers 31A and interlayer insulating layers 31B are etching stopper layers (not shown) made e.g., of SiCN.

With interconnect layer 32e, drain region 11a of nMOS transistor NT1 and drain region 21a of pMOS transistor PT1 are electrically connected to each other. Interconnect layer 32a extends along one (boundary on the lower side in the Y direction in FIG. 5) of the boundaries in the vertical direction (Y direction in FIG. 5) of standard cell 51a in such a manner as to extend in the lateral direction (X direction in FIG. 5) on the boundary. Interconnect layer 32b extends along the other (boundary on the upper side in the Y direction in FIG. 5) of the boundaries in the vertical direction (Y direction in FIG. 5) of standard cell 51a in such a manner as to extend in the lateral direction (X direction in FIG. 5) on the boundary. Interconnect layer 32b is electrically connected to underlying n+ region 25, thereby fixing the potential of n-type well region 2. A power supply potential of either of VDD and GND can be applied to each of interconnect layers 32a and 32b extending along the boundary lines of standard cell 51a, and interconnect layers 32a and 32b correspond to lower layer interconnects of the power supply line.

Specifically, the GND potential can be applied to interconnect layer 32a, and the VDD potential can be applied to interconnect layer 32b.

Interconnect layer 32a is electrically connected to underlying p+ region 15, thereby fixing the potential of p-type well region 1. Interconnect layer 32a has a portion that is separate from a portion linearly extending along one (boundary on the lower side in the Y direction in FIG. 5) of the boundaries in the vertical direction (Y direction in FIG. 5) and extends above standard cell 51a where a function element such as a CMOS inverter is not formed.

Interconnect layer 32b is electrically connected to n+ region 25, thereby fixing the potential of n-type well region 2. Interconnect layer 32b has the portion that is separate from a portion linearly extending along the other (boundary on the upper side in the Y direction in FIG. 5) of the boundaries in the vertical direction (Y direction in FIG. 5) and that extends above standard cell 51a where a function element such as a CMOS inverter is not formed.

Each of interconnect layers 32g and 32h are electrically connected to each of source region 11b of nMOS transistor NT1 and source region 21b of pMOS transistor PT1.

Note that connection of each of interconnect layers 32a, 32b, 32e, 32g and 32h and an impurity region formed on the surface of the semiconductor substrate is performed via the plug layer in contact hole 31a formed in interlayer insulating layer 31A.

Interlayer insulating layer 33 made, e.g., of SiOC and MSQ is formed on interlayer insulating layer 31B so as to cover interconnect layers 32a, 32b, 32e, 32g and 32h. Wiring grooves 33b are formed in the upper surface of interlayer insulating layer 33, and via grooves 33a each reaching each of the underlying interconnect layers from the bottom of each of wiring grooves 33b are formed. In order that interconnect layers 34a to 34d be buried inside via grooves 33a and wiring grooves 33b, interconnect layers 34a to 34d made, e.g., of a CuAl alloy (with an Al content of, e.g., about 0.1 to 1.0%) are formed.

Formed on the side surfaces and the bottom surfaces of via grooves 33a and wiring grooves 33b are barrier metal layers (not shown). The barrier metal layers are positioned between each of interconnect layers 34c and 34d and interlayer insulating layer 33, between each of via grooves 33a and interlayer insulating layer 33, and between each of via grooves 33a and the underlying interconnect layer. The barrier metal layers have a laminated structure, e.g., of tantalum (Ta) and tantalum nitride (TaN).

Formed under interlayer insulating layer 33 is an etching stopper layer (not shown) made e.g., of SiCN.

With interconnect layer 34c, source regions 11b (interconnect layer 32g) of nMOS transistors NT1 in standard cells 51a are electrically connected to one another. Interconnect layer 34c is electrically connected to a branch portion of lower layer interconnect 32a of the power supply line in standard cell 51a where no CMOS inverter is formed.

With interconnect layer 34d, source regions 21b (interconnect layer 32h) of pMOS transistors PT1 in standard cells 51a are electrically connected to one another. Interconnect layer 34d is electrically connected to a branch portion of lower layer interconnect 32b of the power supply line in standard cell 51a where no CMOS inverter is formed.

Interconnect layer 34c, in a plan view shown in FIG. 5, is arranged more inside (central side) in standard cell 51a than lower layer interconnect 32a of the power supply line. Interconnect layer 34d, in a plan view shown in FIG. 5, is arranged more inside (central side) in standard cell 51a than lower layer interconnect 32b of the power supply line.

Note that electrical connection of each of interconnect layers 34c and 34d with interconnect layers 32a, 32b, 32g and 32h is performed through a portion to be buried in each of via grooves 33a of interconnect layers 34c and 34d.

As described above, source region 11b of nMOS transistor NT1 is electrically connected through upper layer interconnect 34c of the power supply line at the GND potential to lower layer interconnect 32a of the power supply line at the GND potential. Source region 21b of pMOS transistor PT1 is electrically connected through upper layer interconnect 34d of the power supply line at the VDD potential to lower layer interconnect 32b of the power supply line at the VDD potential.

According to the embodiment, each of lower layer interconnects 32a and 32b extends along the boundary of standard cell 51a. Accordingly, standard cells 51a adjacent to each other can share lower layer interconnects 32a and 32b. As a result of this, each of standard cells 51a adjacent to each other needs not to independently form lower layer interconnects 32a and 32b, thereby allowing higher integration to be achieved.

Each of upper layer interconnects 34a and 34b extends along the boundary of standard cell 51a. As a result of this, in a similar manner as described above, each of standard cells 51a adjacent to each other needs not to independently form upper layer interconnects 34a and 34b, thereby allowing higher integration to be achieved.

Further, source region 11b of nMOS transistor NT1 is electrically connected through upper layer interconnect 34c of the power supply line at the GND potential to lower layer interconnect 32a of the power supply line at the GND potential. Source region 21b of pMOS transistor PT1 is electrically connected through upper layer interconnect 34d of the power supply line at the VDD potential to lower layer interconnect 32b of the power supply line at the VDD potential. Therefore, each of lower layer interconnects 32a and 32b positioned at the boundary of standard cells 51a needs not to extend to the central portion of standard cell 51a where transistors are positioned. This creates an open space in a portion leading to the central portion of standard cell 51a where each of lower layer interconnects 32a and 32b should have extended, and therefore other interconnects such as signal lines 32c and 32d can be arranged in the open space, allowing higher integration to be achieved.

Figure 7:
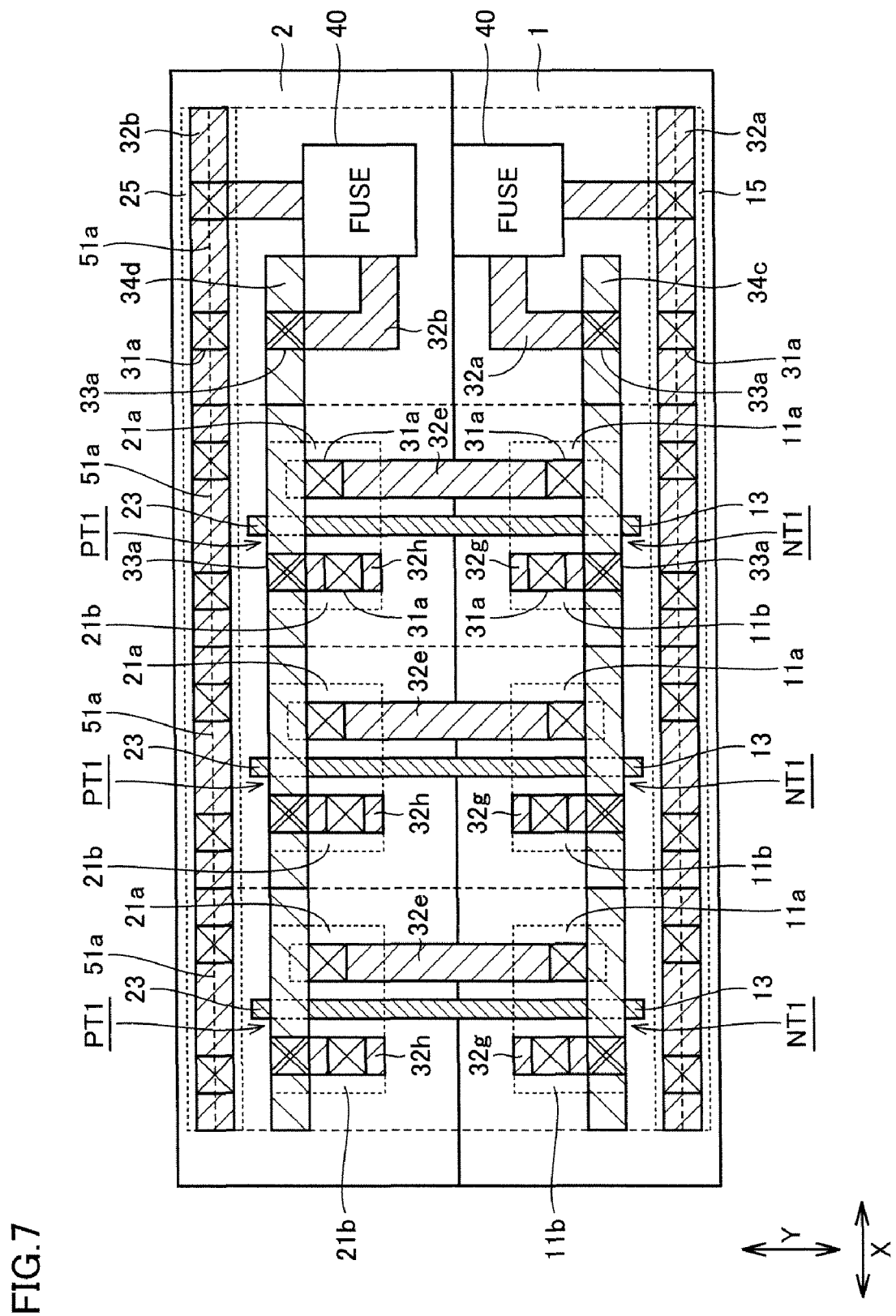
FIG. 7 is a plan view schematically showing the configuration in which a fuse is formed in a standard cell having no function element formed therein in the configuration of FIG. 5.

From the above, a semiconductor device can be obtained that can achieve both higher speeds and higher integration. Note that in the second embodiment, fuses 40 as shown in FIG. 7 may be disposed in standard cell 51a where no function element (e.g., CMOS inverter) is formed in FIG. 5. A column made of a plurality of standard cells 51a in which such fuses 40 are arranged may further exist in a semiconductor device. This fuse 40 may be arranged, e.g., somewhere along the path of the branch portion of lower layer interconnects 32a and 32b of the power supply line.

The configuration of FIG. 7 other than this point is substantially the same as that of FIGS. 5 and 6, and therefore elements of FIG. 7 identical to those in FIGS. 5 and 6 are indicated by the same reference characters, and the same description is not repeated.

Regarding FIG. 5, the configuration has been described in which upper layer interconnect 34c of the power supply line is electrically connected to lower layer interconnect 32a and upper layer interconnect 34d of the power supply line is electrically connected to lower layer interconnect 32b in standard cell 51a where no function element is formed. In the second embodiment, however, as shown in FIG. 8, a column made of a plurality of standard cells 51a in which upper layer interconnect 34c of the power supply line is not electrically connected to lower layer interconnect 32a and upper layer interconnect 34d of the power supply line is not electrically connected to lower layer interconnect 32b in standard cell 51a where no function element is formed may further exist in a semiconductor device.

Figure 8:
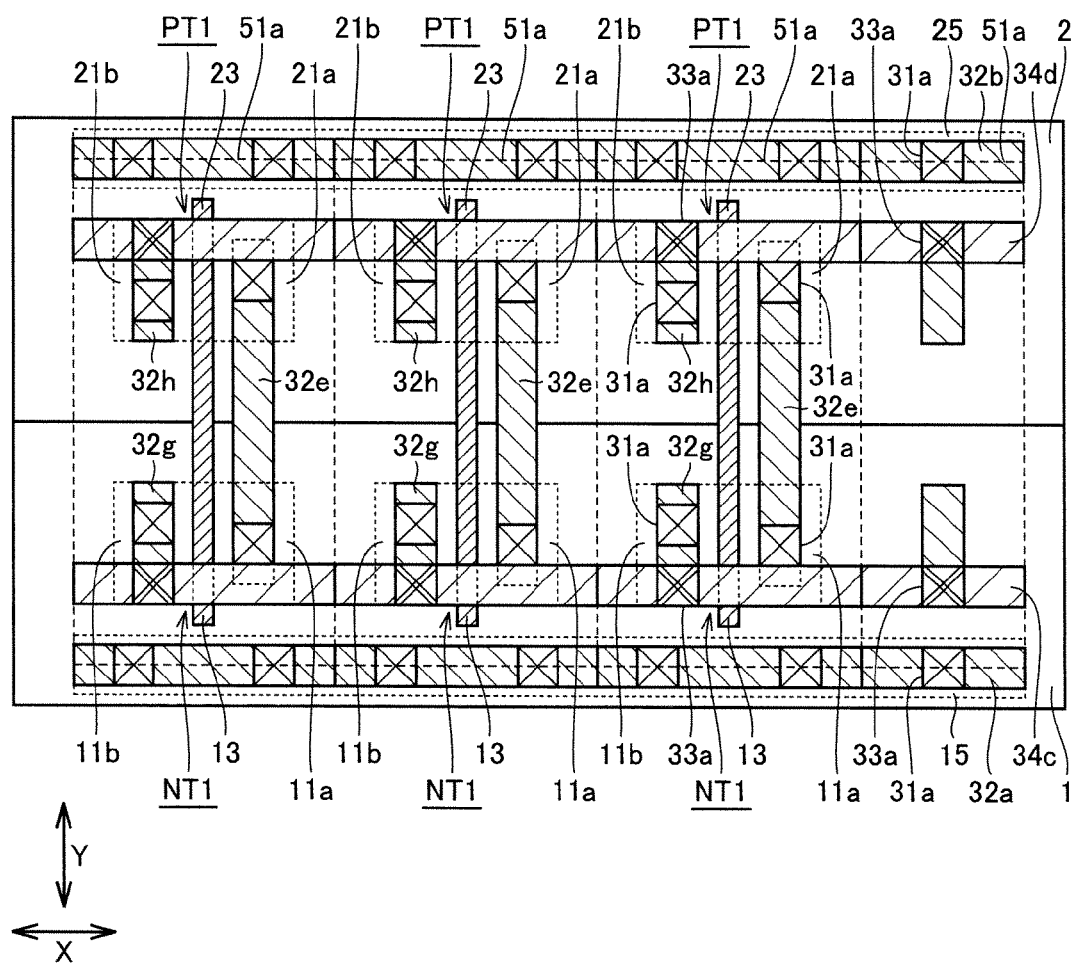
FIG. 8 is a plan view schematically showing the configuration in which upper layer interconnects and lower layer interconnects of power supply lines are not connected in a standard cell having no function element formed therein in the configuration of FIG. 5.

The configuration of FIG. 8 other than this point is substantially the same as that of FIGS. 5 and 6, and therefore elements of FIG. 7 identical to those in FIGS. 5 and 6 are indicated by the same reference characters, and the same description is not repeated.

As shown in FIG. 5 of the second embodiment, a mode in which upper layer interconnect 34c of the power supply line is electrically connected to lower layer interconnect 32a and upper layer interconnect 34d of the power supply line is electrically connected to lower layer interconnect 32b in standard cell 51a where no function element is formed will be referred to as a "mode A". As shown in FIG. 8, a mode in which upper layer interconnect 34c of the power supply line is not electrically connected to lower layer interconnect 32a and upper layer interconnect 34d of the power supply line is not electrically connected to lower layer interconnect 32b in standard cell 51a where no function element is formed will be referred to as a "mode B".

Only by changing these modes A and B at the design stage of a semiconductor device, the column of a plurality of standard cells 51a having mode A can be designed so as to be able to be used as a cell column that allows high-speed operations, and the column of a plurality of standard cells 51a having mode B can be designed so as to be able to be used as a cell column that allows operations with low power consumption.

In the column of a plurality of standard cells 51a having mode A, operation current is supplied by the power supply line from a plurality of layers, thus allowing high-speed operations. In the column of a plurality of standard cells 51a having mode B, the potential relationship is made such that the potential of lower layer interconnect 32a is smaller than that of upper layer interconnect 34c, the potential of upper layer interconnect 34c is smaller than that of upper layer interconnect 34d, and the potential of upper layer interconnect 34d is smaller than that of lower layer interconnect 32b. Thus, different voltages are supplied to the substrate and the sources of nMOS transistor NT1 and pMOS transistor PT1 so that the potential of the substrate and the potential of the sources are different potentials, thereby increasing the thresholds (Vth) of transistors due to the substrate effect. In this way, the standby current of a circuit including standard cells 51a can be reduced, and therefore operations with low power consumption becomes possible.

These mode A and mode B are very similar in the size of a cell, and therefore can be easily changed to each other. The cell column that allows high-speed operations and the cell column that allows operations with low power consumption can be easily changed to each other.

A mode in which fuse 40 is arranged in standard cell 51a where no function element is formed, as shown in FIG. 7, will be referred to as a "mode C". With this mode C, in the test process of products, high-speed operations and operations with low power consumption as described above can be changed to each other by the presence or absence of fuse blowing. As the device size decreases in semiconductor process technology, a problem with variations in characteristics after the completion of wafer processes of products is being aggravated. However, it is possible to reduce variations in characteristics by selecting, in the test process, standard cell 51a for the purpose, i.e., the purpose of high-speed operations or the purpose of operations with low power consumption. For example, it is conceivable that shifting threshold voltage Vth of a transistor in a direction of reducing the voltage causes the power consumption to be larger than the target power consumption while causing the operation speed to be sufficiently faster than the target speed. In this case, blowing of fuse 40 makes a potential relationship as in a column of a plurality of standard cells 51a having mode B. Thus, power consumption can be suppressed to be within the target power consumption by reduction in power consumption due to substrate effect.

(Third Embodiment)

The present embodiment realizes the circuit configuration shown in FIG. 2 by modifying the configuration of the second embodiment.

Figure 9:
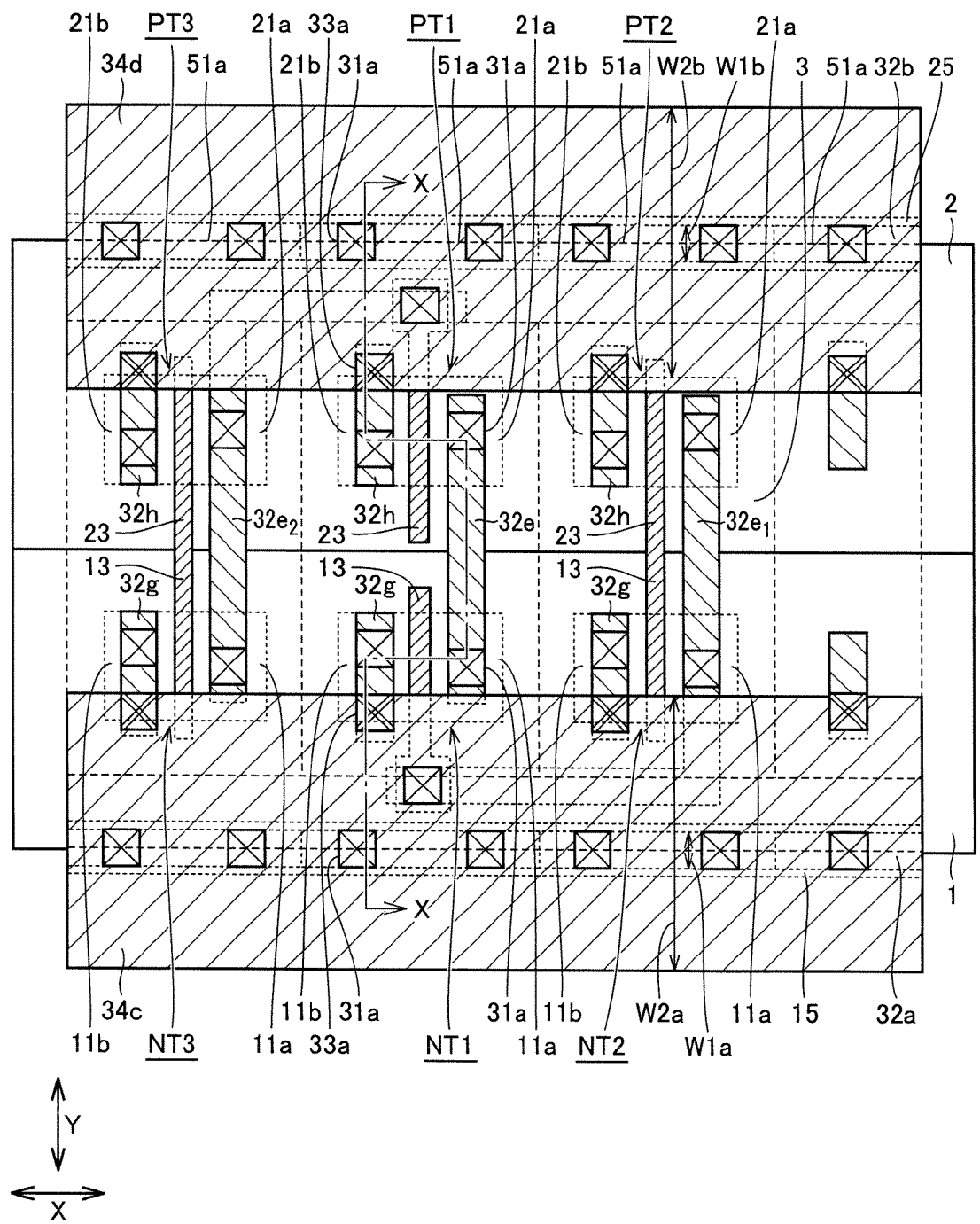
FIG. 9 is a plan view schematically showing a state where a plurality of standard cells of a semiconductor device in a third embodiment of the invention are aligned.
Figure 10:
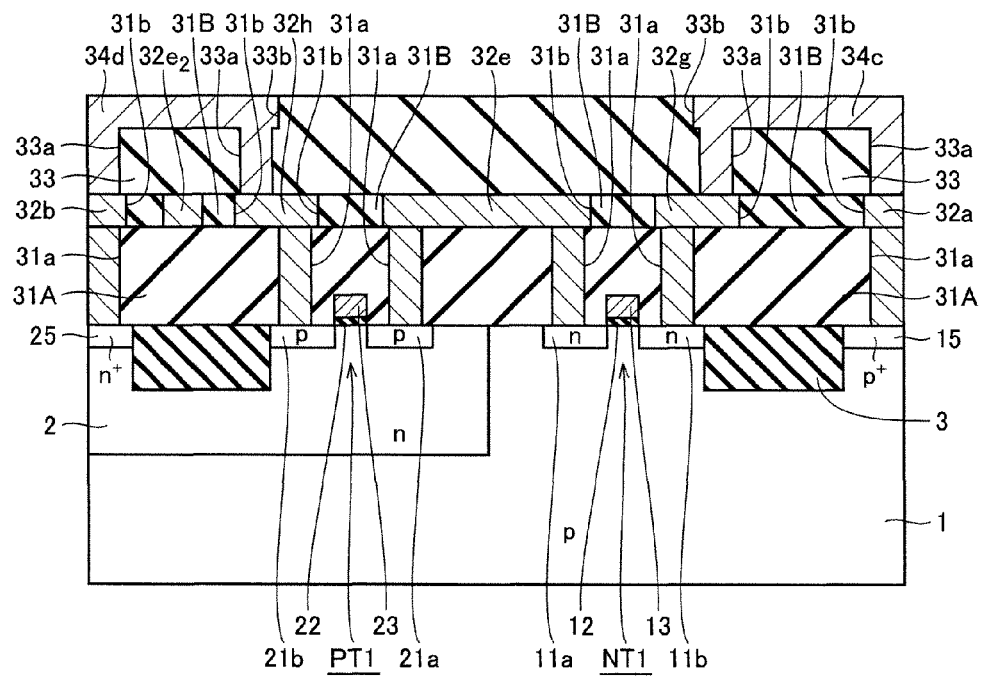
FIG. 10 is a schematic sectional view taken along the line X-X of FIG. 9.

With reference to FIGS. 9 and 10, in the configuration of the embodiment, for example, nMOS transistor NT1 and pMOS transistor PT1 in the central standard cell 51a, among three aligned standard cells 51a having inverters, correspond to the CMOS inverter of the output stage in FIG. 2.

A CMOS inverter including nMOS transistor NT2 and pMOS transistor PT2 in right-hand standard cell 51a adjacent to the central standard cell 51a in the drawing and a CMOS inverter including nMOS transistor NT3 and pMOS transistor PT3 of left-hand standard cell 51a adjacent to the central standard cell 51a in the drawing correspond to the driver in FIG. 2.

Gate electrode layer 13 of nMOS transistor NT1 and gate electrode layer 23 of pMOS transistor PT1 in the central standard cell 51a are electrically separated. An interconnect layer $32e_1$ in right-hand standard cell 51a is electrically connected to gate electrode layer 13 of central standard cell 51a, and corresponds to signal line 32c in the first embodiment. This interconnect layer $32e_1$ electrically connects drain region 11a of nMOS transistor NT2 with drain region 21a of pMOS transistor PT2.

An interconnect layer $32e_2$ in left-hand standard cell 51a is electrically connected to gate electrode layer 23 of central standard cell 51a, and corresponds to signal line 32d in the first embodiment. This interconnect layer $32e_2$ electrically connects drain region 11a of nMOS transistor NT3 with drain region 21a of pMOS transistor PT3.

Upper layer interconnect 34c of the power supply line has line width W2a larger than line width W1a of lower layer interconnect 32a extending in parallel to the underlying layer of upper layer interconnect 34c, and upper layer interconnect 34d has line width W2b larger than line width W1b of lower layer interconnect 32b extending in parallel to the underlying layer of upper layer interconnect 34d. Thus, upper layer interconnect 34c, in a plan view shown in FIG. 9, has a portion positioned more inside in standard cell 51a than lower layer interconnect 32a. The portion of upper layer interconnect 34c positioned more inside than lower layer interconnect 32a overlaps interconnect layer 32g in a plan view, and is electrically connected through via hole 33a to interconnect layer 32g.

Upper layer interconnect 34d of the power supply line, in a plan view shown in FIG. 9, has a portion positioned more inside in standard cell 51a than lower layer interconnect 32b. The portion of upper layer interconnect 34d positioned more inside than lower layer interconnect 32b overlaps interconnect layer 32h in a plan view, and is electrically connected through via hole 33a to interconnect layer 32h.

Each of lower layer interconnects 32a and 32b of the power supply line linearly extends along the boundary line of standard cell 51a, and does not have a branch portion extending from the boundary portion to the inside of standard cell 51a.

As described above, source region 11b of nMOS transistor NT1 is electrically connected through upper layer interconnect 34c of the power supply line at the GND potential to lower layer interconnect 32a of the power supply line at the GND potential. Source region 21b of pMOS transistor PT1 is electrically connected through upper layer interconnect 34d of the power supply line at the VDD potential to lower layer interconnect 32b of the power supply line at the VDD potential.

Signal line $32e_1$, in a plan view shown in FIG. 9, is arranged to be positioned between a connection portion (via hole 33a) of upper layer interconnect 34c of the power supply line with interconnect layer 32g and lower layer interconnect 32a. Signal line $32e_2$, in a plan view shown in FIG. 9, is arranged to be positioned between a connection portion (via hole 33a) of upper layer interconnect 34d of the power supply line with interconnect layer 32h and lower layer interconnect 32b.

Note that the configuration of the present embodiment other than the above points is substantially the same as that of the second embodiment shown in FIGS. 5 and 6, and therefore elements of the present embodiment identical to those in the second embodiment are indicated by the same reference characters, and the same description is not repeated.

According to the present embodiment, the power supply line of the GND potential is separated into lower layer interconnect 32a and upper layer interconnect 34c, and the power supply line of the VDD potential is separated into lower layer interconnect 32b and upper layer interconnect 34d. Therefore, this case has an increased number of electric current paths as compared to a case of the power supply line being a single layer, and therefore allows higher speeds to be achieved. The number of electric current paths can be increased without increasing the line width of the power supply line, thus allowing higher integration to be achieved.

Upper layer interconnects 34c and 34d have line widths W2a and W2b larger than line widths W1a and W1b of lower layer interconnects 32a and 32b, thus allowing the resistance value of the power supply line to be reduced.

Lower layer interconnects 32a and 32b have line widths W1a and W1b smaller than line widths W2a and W2b of upper layer interconnects 34c and 34d, thus increasing an open space for arranging interconnects accordingly. Thus, it becomes easy to arrange other interconnects (e.g., signal lines $32e_1$ and $32e_2$) in the same layer as that of lower layer interconnects 32a and 32b, improving the freedom of the planar layout of other interconnects.

Each of lower layer interconnects 32a and 32b extends along the boundary of standard cell 51a. Accordingly, standard cells 51a adjacent to each other can share lower layer interconnects 32a and 32b. As a result of this, there is no need for lower layer interconnects 32a and 32b to be formed independently in each of standard cells 51a adjacent to each other, thereby allowing higher integration to be achieved.

Each of upper layer interconnects 34c and 34d extends along the boundary of standard cell 51a, and therefore, in a similar manner as described above, there is no need for upper layer interconnects 34c and 34d to be formed independently in each of standard cells 51a adjacent to each other, thereby allowing higher integration to be achieved.

Further, source region 11b of each of nMOS transistors NT1 to NT3 is electrically connected through upper layer interconnect 34c of the power supply line at the GND potential to lower layer interconnect 32a of the power supply line at the GND potential. Source region 21b of each of pMOS transistors PT1 to PT3 is electrically connected through upper layer interconnect 34d of the power supply line at the VDD potential to lower layer interconnect 32b of the power supply line at the VDD potential. Therefore, each of lower layer interconnects 32a and 32b positioned at the boundaries of standard cells 51a needs not to extend to a central portion of standard cell 51a where transistors are positioned. This creates an open space in a portion leading to the central portion of standard cell 51a where each of lower layer interconnects 32a and 32b should have extended, and therefore other interconnects such as signal lines $32e_1$ and $32e_2$ can be arranged in the open space, allowing higher integration to be achieved.

As a result of arranging signal lines $32e_1$ and $32e_2$ in the open space in this way, signal line $32e_1$, in a plan view shown in FIG. 9, can be arranged to be positioned between a connection portion of upper layer interconnect 34c of the power supply line with interconnect layer 32g and lower layer interconnect 32a. Signal line $32e_2$, in a plan view shown in FIG. 9, can be arranged to be positioned between a connection portion of upper layer interconnect 34d of the power supply line with interconnect layer 32h and lower layer interconnect 32b.

From the above, a semiconductor device can be obtained that can achieve both higher speeds and higher integration.

It should be noted that although an element having a CMOS inverter has been described as a function element in the foregoing first to third embodiments, the present invention is not limited to this and may be applied CMOS NAND and NOR circuits and other function elements.

(Fourth Embodiment)

Figure 11:
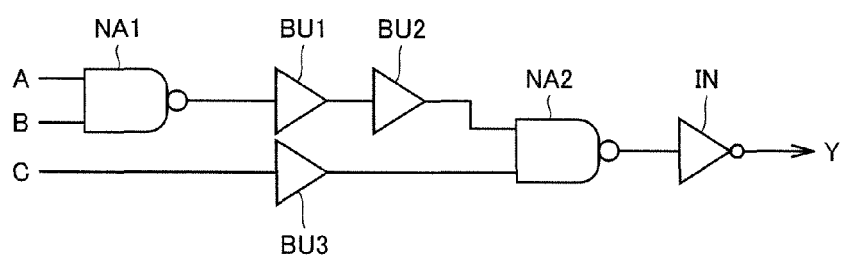
FIG. 11 is a circuit diagram showing the circuit configuration of a semiconductor device in a fourth embodiment of the invention.
Figure 12:
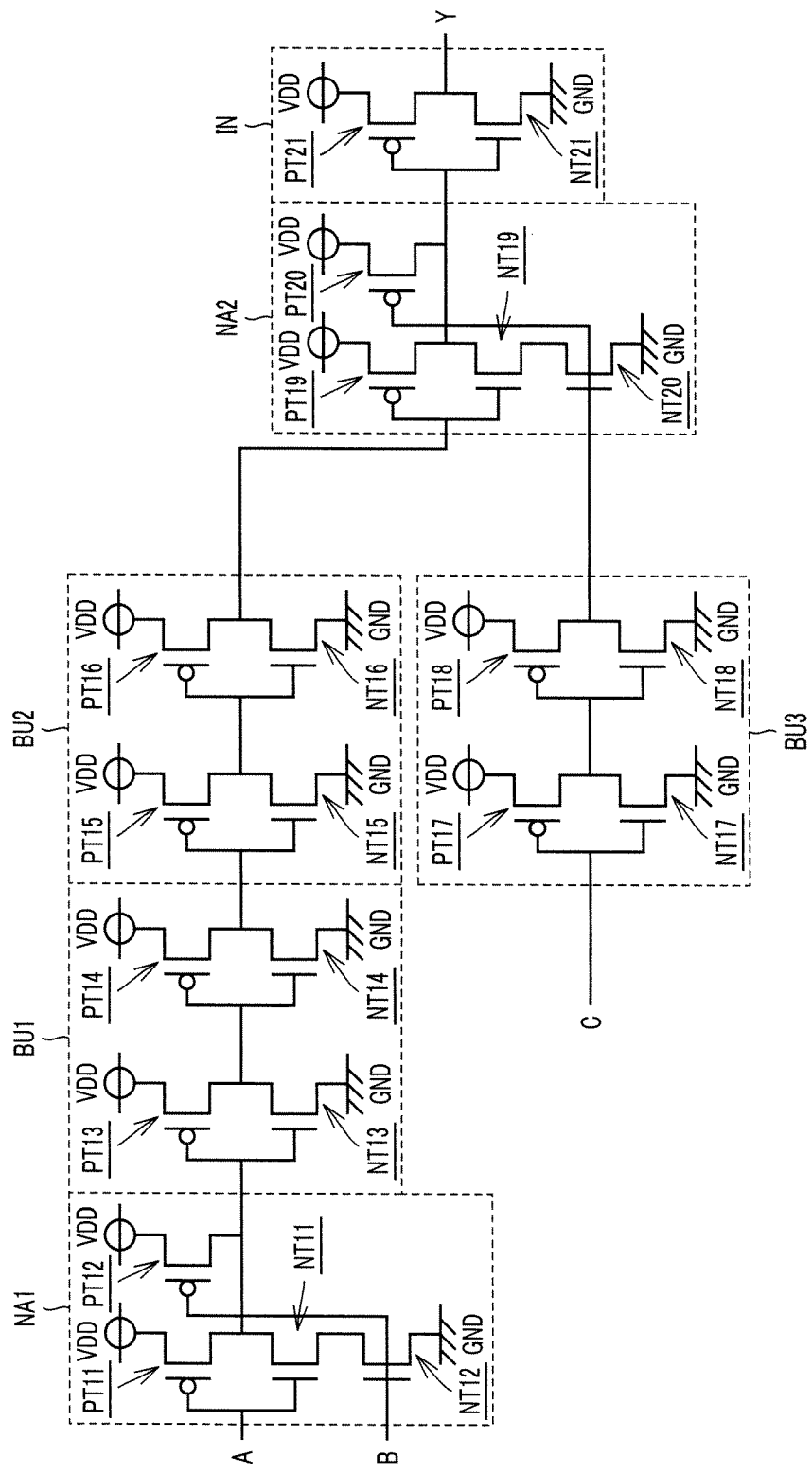
FIG. 12 is a circuit diagram showing the circuit diagram shown in FIG. 11 at its transistor level.

With reference to FIGS. 11 and 12, a circuit of the present embodiment includes two-input NAND gates NA1 and NA2, buffers BU1, BU2 and BU3, and an inverter IN.

Two-input NAND gate NA1 includes pMOS transistors PT11 and PT12 and nMOS transistors NT11 and NT12 connected as shown in FIG. 12. A terminal A is electrically connected to each gate of pMOS transistor PT11 and nMOS transistor NT11, and a terminal B is electrically connected to each gate of pMOS transistor PT12 and nMOS transistor NT12.

Buffer BU1 is composed of a CMOS inverter including a pMOS transistor PT13 and an nMOS transistor NT13 and a CMOS inverter including a pMOS transistor PT14 and an nMOS transistor NT14. This buffer BU1 is configured such that output of NAND gate NA1 is input to buffer BU1.

Buffer BU2 is composed of a CMOS inverter including a pMOS transistor PT15 and an nMOS transistor NT15 and a CMOS inverter including a pMOS transistor PT16 and an nMOS transistor NT16. This buffer BU2 is configured such that output of buffer BU1 is input to buffer BU2.

Buffer BU3 is composed of a CMOS inverter including a pMOS transistor PT17 and an nMOS transistor NT17 and a CMOS inverter including a pMOS transistor PT18 and an nMOS transistor NT18. A terminal C is electrically connected to each gate of pMOS transistor PT17 and nMOS transistor NT17.

Two-input NAND gate NA2 includes pMOS transistors PT19 and PT20 and nMOS transistors NT19 and NT20 connected as shown in FIG. 12. Output of buffer BU2 is electrically connected to each gate of pMOS transistor PT19 and nMOS transistor NT19. Output of buffer BU3 is electrically connected to each gate of pMOS transistor PT20 and nMOS transistor NT20.

Inverter IN is made of a CMOS inverter including a pMOS transistor PT21 and an nMOS transistor NT21. Output of NAND gate NA2 is electrically connected to each gate of pMOS transistor PT21 and nMOS transistor NT21. Output of Inverter IN is electrically connected to a terminal Y.

Next, the plan layout configuration of a semiconductor device constituting the circuit shown in FIGS. 11 and 12 will be described.

Figure 13:
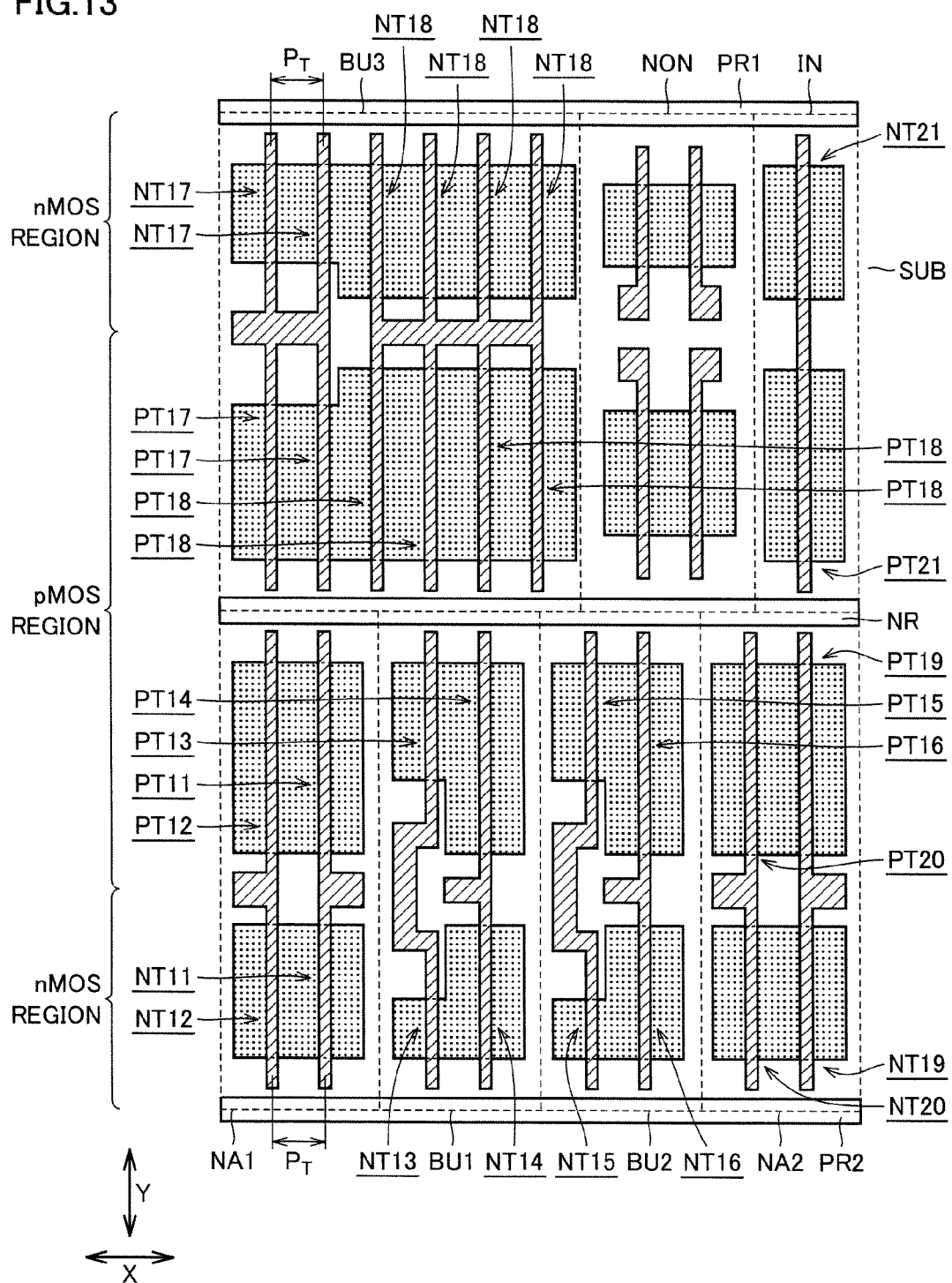
FIG. 13 is a schematic plan view showing the plan layout configuration of a semiconductor device constituting the circuit shown in FIGS. 11 and 12, and shows diffusion regions and isolation regions formed in a semiconductor substrate, and a polysilicon layer such as a gate electrode layer formed on the semiconductor substrate.
Figure 14:
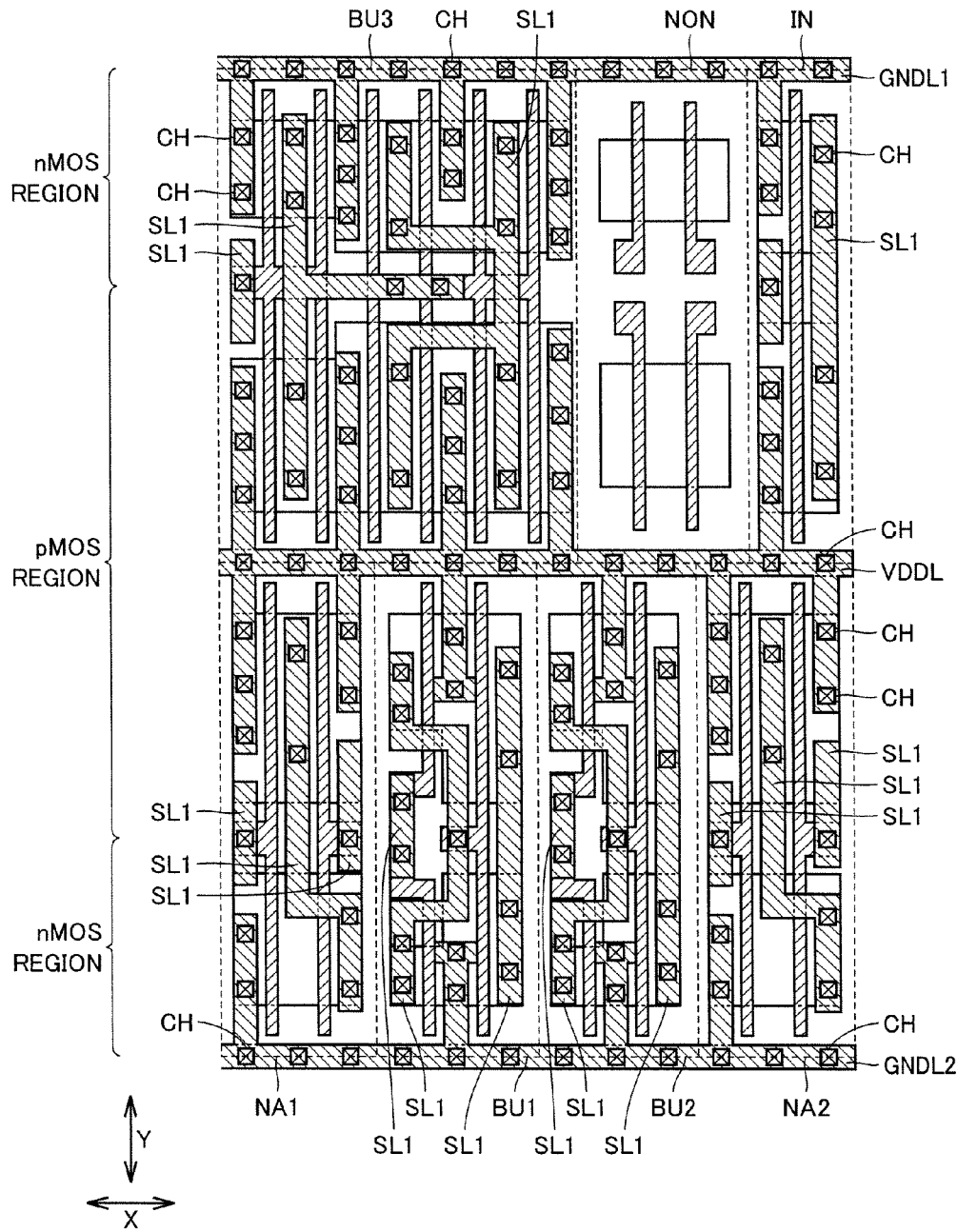
FIG. 14 is a schematic plan view showing the plan layout configuration of a semiconductor device constituting the circuit shown in FIGS. 11 and 12, and mainly shows the polysilicon layer and a first metal layer formed thereabove.
Figure 15:
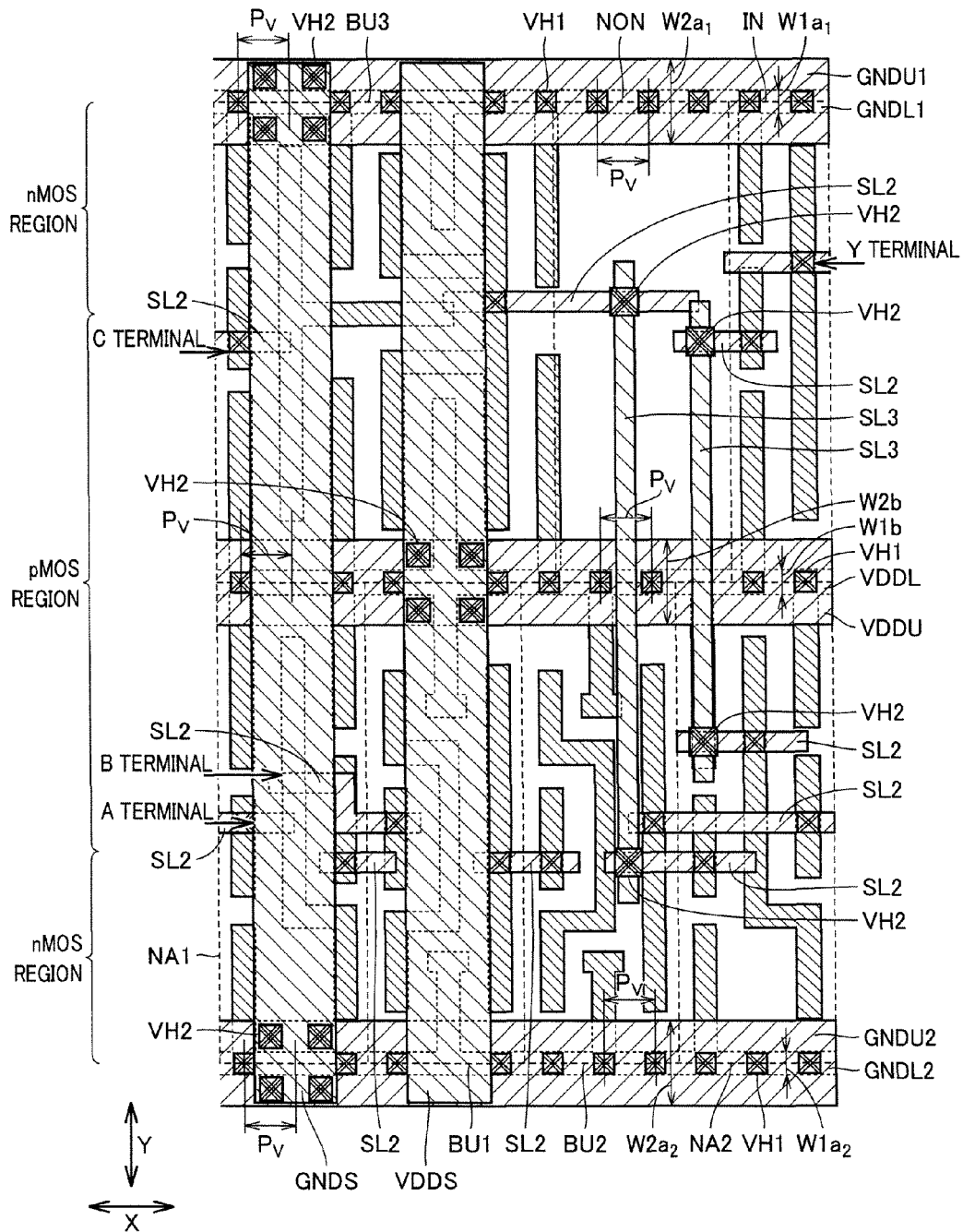
FIG. 15 is a schematic plan view showing the plan layout configuration of a semiconductor device constituting the circuit shown in FIGS. 11 and 12, and shows the first metal layer and a second metal layer and a third metal layer formed thereabove.

FIG. 13 shows polysilicon layers such as diffusion regions and element isolation regions formed in a semiconductor substrate and a gate electrode layer formed on the semiconductor substrate. FIG. 14 mainly shows the polysilicon layer mentioned above and a first metal layer formed thereon. FIG. 15 shows the first metal layer mentioned above and a second metal layer and a third metal layer formed thereon.

With reference to FIG. 13, there are NAND gate formation regions NA1 and NA2, buffer formation regions BU1, BU2 and BU3, an inverter formation region IN and a non-circuit region NON on the surface of a semiconductor substrate SUB. Each of these formation regions is a standard cell.

Buffer formation region BU3, non-circuit region NON and inverter formation region IN are arranged in series in this order in the X direction in the drawing. NAND gate formation region NA1, buffer formation region BU1, buffer formation region BU2 and NAND gate formation region NA2 are arranged in series in this order in the X direction in the drawing.

Formed in NAND gate formation region NA1 are foregoing pMOS transistors PT11 and PT12 and nMOS transistors NT11 and NT12. Formed in buffer formation region BU1 are foregoing pMOS transistors PT13 and PT14 and nMOS transistors NT13 and NT14. Formed in buffer formation region BU2 are foregoing pMOS transistors PT15 and PT16 and nMOS transistors NT15 and NT16. Formed in NAND gate formation region NA2 are foregoing pMOS transistors PT19 and PT20 and nMOS transistors NT19 and NT20.

Formed in buffer formation region BU3 are foregoing pMOS transistors PT17 and PT18 and nMOS transistors NT17 and NT18. Formed in inverter formation region IN are foregoing pMOS transistors PT21 and nMOS transistor NT21.

A p+ region PR1 is formed on the surface in semiconductor substrate SUB such that p+ region PR1 extends in the X direction in the drawing along a boundary on the upper side in the Y direction in the drawing of buffer formation region BU3, non-circuit region NON and inverter formation region IN. A p+ region PR2 is formed on the surface in semiconductor substrate SUB such that p+ region PR2 extends in the X direction in the drawing along a boundary on the lower side in the Y direction in the drawing of NAND gate formation region NA1, buffer formation regions BU1 and BU2, and NAND gate formation region NA2.

An n+ region NR is formed along a boundary on the lower side of the Y direction in the drawing of buffer formation region BU3, non-circuit region NON and inverter formation region IN, the boundary being also a boundary on the upper side of the Y direction in the drawing of NAND gate formation region NA1, buffer formation regions BU1 and BU2, and NAND gate formation region NA2. This n+ region NR is formed on the surface in semiconductor substrate SUB in such a manner as to extend in the X direction in the drawing along the boundary.

With reference to FIG. 14, a patterned first metal layer is formed above MOS transistors with an interlayer insulating layer (not shown) interposed therebetween. This first metal layer includes lower layer interconnects GNDL1 and GNDL2 of the power supply line at the GND potential, a lower layer interconnect VDDL of the power supply line at the VDD potential, and other signal interconnects SL1.

Lower layer interconnect GNDL1 extends in the X direction in the drawing along a boundary on the upper side of the Y direction in the drawing of buffer formation region BU3, non-circuit region NON and inverter formation region IN. This lower layer interconnect GNDL1 is electrically connected to underlying p+ region PR1 through a plurality of contact holes CH.

Lower layer interconnect GNDL2 extends in the X direction in the drawing along a boundary on the lower side of the Y direction in the drawing of NAND gate formation region NA1, buffer formation regions BU1 and BU2, and NAND gate formation region NA2. This lower layer interconnect GNDL2 is electrically connected to underlying p+ region PR1 through the plurality of contact holes CH.

Lower layer interconnect VDDL extends in the X direction in the drawing along the boundary on the lower side of the Y direction in the drawing of buffer formation region BU3, non-circuit region NON and inverter formation region IN, the boundary being also the boundary on the upper side of the Y direction in the drawing of NAND gate formation region NA1, buffer formation regions BU1 and BU2, and NAND gate formation region NA2. Lower layer interconnect VDDL is electrically connected to underlying n+ region NR through the plurality of contact holes CH.

With reference to FIG. 15, a patterned second metal layer is formed above the first metal layer with an interlayer insulating layer (not shown) interposed therebetween. This second metal layer includes upper layer interconnects GNDU1 and GNDU2 of the power supply line at the GND potential, an upper layer interconnect VDDU of the power supply line at the VDD potential, and other signal interconnects SL2.

Upper layer interconnect GNDU1 extends in the X direction in the drawing along the boundary on the upper side of the Y direction in the drawing of buffer formation region BU3, non-circuit region NON and inverter formation region IN. This upper layer interconnect GNDU1 is electrically connected to underlying lower layer interconnect GNDL1 through a plurality of via holes VH1. Upper layer interconnect GNDU1 has a line width $W2a_1$ larger than a line width $W1a_1$ of lower layer interconnect GNDL1.

Upper layer interconnect GNDU2 extends in the X direction in the drawing along the boundary on the lower side of the Y direction in the drawing of NAND gate formation region NA1, buffer formation regions BU1 and BU2, and NAND gate formation region NA2. This upper layer interconnect GNDU2 is electrically connected to underlying lower layer interconnect GNDL2 through a plurality of via holes VH1. Upper layer interconnect GNDU2 has a line width $W2a_2$ larger than a line width $W1a_2$ of lower layer interconnect GNDL2.

Upper layer interconnect VDDU extends in the X direction in the drawing along the boundary on the lower side of the Y direction in the drawing of buffer formation region BU3, non-circuit region NON and inverter formation region IN, the boundary being also the boundary on the upper side of the Y direction in the drawing of NAND gate formation region NA1, buffer formation regions BU1 and BU2, and NAND gate formation region NA2. This upper layer interconnect VDDU is electrically connected to underlying lower layer interconnect VDDL through the plurality of via holes VH1. Upper layer interconnect VDDU has line width W2b larger than line width W1b of lower layer interconnect VDDL.

A patterned third metal layer is formed above the second metal layer with an interlayer insulating layer (not shown) interposed therebetween. This third metal layer includes reinforcing interconnect GNDS for reinforcing the potential of the power supply line at the GND potential, reinforcing interconnect VDDS for reinforcing the potential of the power supply line at the VDD potential, and other signal interconnects SL3.

Each of reinforcing interconnect GNDS and reinforcing interconnect VDDS extends in a direction orthogonal to upper layer interconnects GNDU1, GNDU2 and VDDU (in the Y direction in the drawing), as viewed from a plane. Reinforcing interconnect GNDS intersects each of upper layer interconnects GNDU1 and GNDU2, as viewed from a plane, and is electrically connected to upper layer interconnects GNDU1 and GNDU2 by a plurality of (e.g., four) via holes VH2 at one intersection. Reinforcing interconnect VDDS intersects upper layer interconnect VDDU, as viewed from a plane, and is electrically connected to upper layer interconnect VDDU by a plurality of (e.g., four) via holes VH2 at one intersection.

Signal lines SL1, SL2 and SL3 in layers electrically connect MOS transistors so that MOS transistors each have the circuit configuration shown in FIGS. 11 and 12. Further, in FIG. 13, portions indicated by slant lines are polysilicon layers such as gate electrode layers formed on the semiconductor substrate, and portions indicated by polka dots are diffusion regions formed in the semiconductor substrate. These polysilicon layers and diffusion regions are electrically connected so that MOS transistors each have the circuit configuration shown in FIGS. 11 and 12.

An arrangement pitch $P_V$ of a plurality of via holes VH1 connecting lower layer interconnect GNDL1 and upper layer interconnect GNDU1 shown in FIG. 15 is the same as an arrangement pitch $P_T$ of transistors shown in FIG. 13. Arrangement pitch $P_V$ of the plurality of via holes VH1 connecting lower layer interconnect GNDL2 and upper layer interconnect GNDU2 and arrangement pitch $P_V$ of the plurality of via holes VH1 connecting lower layer interconnect VDDL and upper layer interconnect VDDU shown in FIG. 15 are also the same as an arrangement pitch $P_T$ of transistors shown in FIG. 13. This can reduce the resistance value of the power supply line, and can reinforce the potentials of lower layer interconnects and upper layer interconnects.

Figure 16:
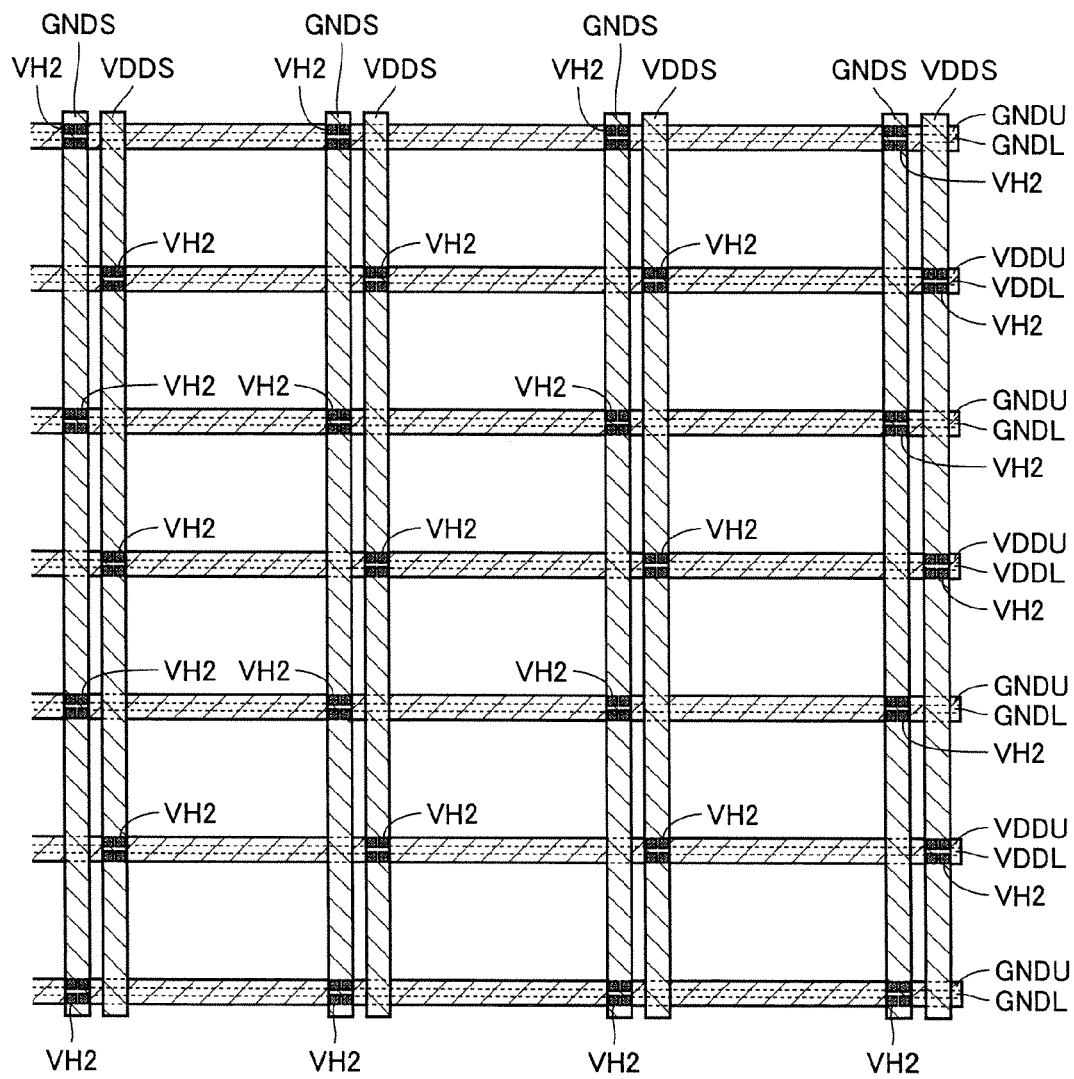
FIG. 16 is a schematic plan view showing a state of reinforcing interconnects GNDS and reinforcing interconnects VDDS shown in FIG. 15.

With reference to FIG. 16, a plurality of reinforcing interconnects GNDS and VDDS and a plurality of upper layer interconnects GNDU and VDDU are arranged such that they constitute a lattice as viewed from a plane.

Each of the plurality of reinforcing interconnects GNDS is electrically connected to the plurality of upper layer interconnects GNDU (including GNDU1 and GNDU2) through via holes VH2. Each of the plurality of reinforcing interconnects VDDS is electrically connected to the plurality of upper layer interconnects VDDU through via holes VH2.

According to the present embodiment, the power supply line at the GND potential is separated into lower layer interconnects GNDL1 and GNDL2 and upper layer interconnects GNDU1 and GNDU2, and the power supply line at the VDD potential is separated into lower layer interconnect VDDL and upper layer interconnect VDDU. Therefore, this case has an increased number of electric current paths as compared to a case of the power supply line being a single layer, and therefore allows higher speeds to be achieved. The number of electric current paths can be increased without increasing the line width of the power supply line, thus allowing higher integration to be achieved.

Line widths $W2a_1$, $W2a_2$ and $W2b$ of upper layer interconnects GNDU1, GNDU2 and VDDU are larger than line widths $W1a_1$, $W1a_2$ and $W1b$ of lower layer interconnects GNDL1, GNDL2 and VDDL, respectively, thus allowing the resistance value of the power supply line to be reduced.

Line widths $W1a_1$, $W1a_2$ and $W1b$ of lower layer interconnects GNDL1, GNDL2 and VDDL are smaller than line widths $W2a_1$, $W2a_2$ and $W2b$ of upper layer interconnects GNDU1, GNDU2 and VDDU, respectively, thus increasing an open space for arranging interconnects accordingly. Therefore, it becomes easy to arrange other interconnects in the same layer as that of lower layer interconnects GNDL1, GNDL2 and VDDL, improving the freedom of the planar layout of other interconnects.

Lower layer interconnects GNDL1, GNDL2 and VDDL and upper layer interconnects GNDU1, GNDU2 and VDDU each extend along the boundary of standard cell 51a. Accordingly, standard cells 51a adjacent to each other can share the power supply line of these interconnects. As a result of this, there is no need for the power supply line of these interconnects to be formed independently in each standard cell, thereby allowing higher integration to be achieved.

Signal lines SL1 of the first metal layer are used as interconnects in the standard cell. Signal lines SL2 of the second metal layer extend along the X direction in the drawing, and are used as interconnects for connection between standard cells arranged in such a manner as to be sandwiched by power supply type interconnects such as lower layer interconnects GNDL1, GNDL2 and VDDL. Further, signal lines SL3 of the third metal layer extend along the Y direction in the drawing, and are used as interconnects for connection between standard cells arranged in such a manner as to stride power supply type interconnects such as lower layer interconnects GNDL1, GNDL2 and VDDL. This facilitates interconnect design in place and route (P&R), i.e., automatic interconnect arrangement.

From the above, a semiconductor device can be obtained that can achieve both higher speeds and higher integration.

(Fifth Embodiment)

In the present embodiment, a semiconductor device having high-speed cells and high-integration cells will be described.

Figure 17:
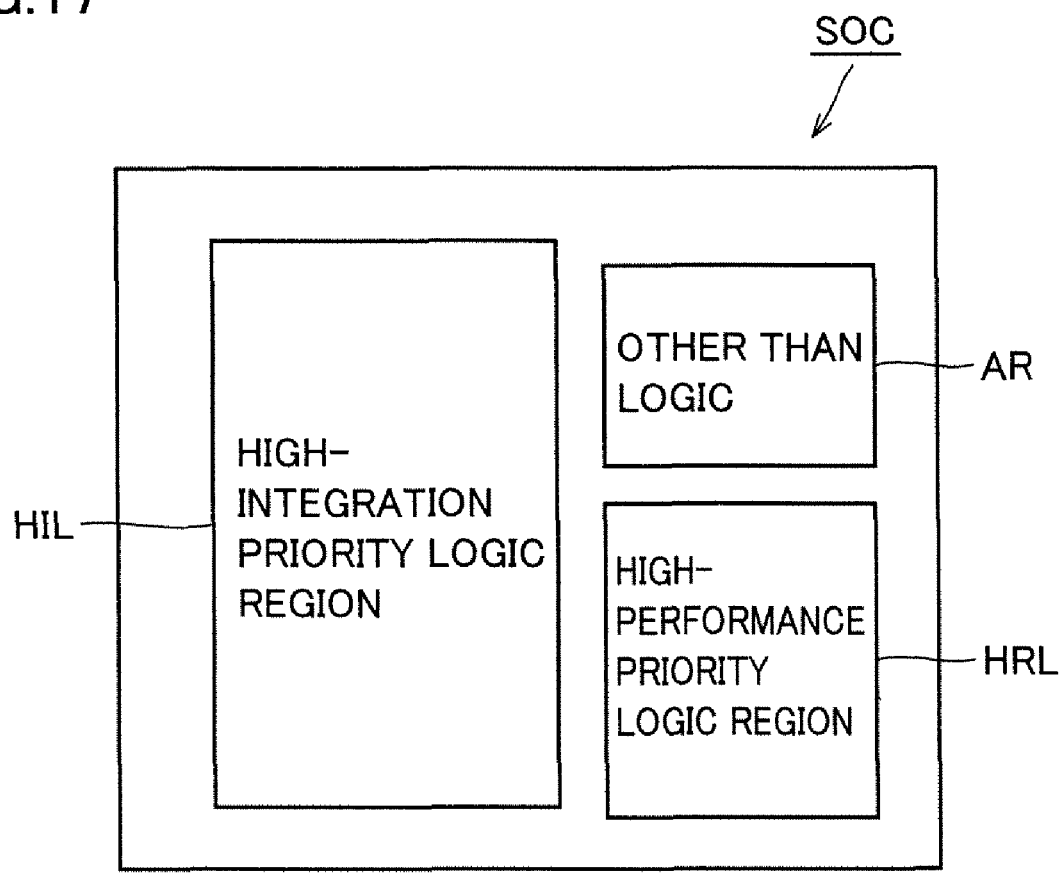
FIG. 17 is a plan view schematically showing the configuration of an SOC chip as a semiconductor device in a fifth embodiment of the invention.

With reference to FIG. 17, an SOC chip SOC includes, e.g., high-integration priority logic region HIL, high-performance priority logic region HRL, and a region AR other than the logic regions. In high-integration priority logic region HIL, high-speed cells suitable for high-speed operations are formed. In high-performance priority logic region HRL, high-integration cells suitable for high integration are formed.

Figure 19:
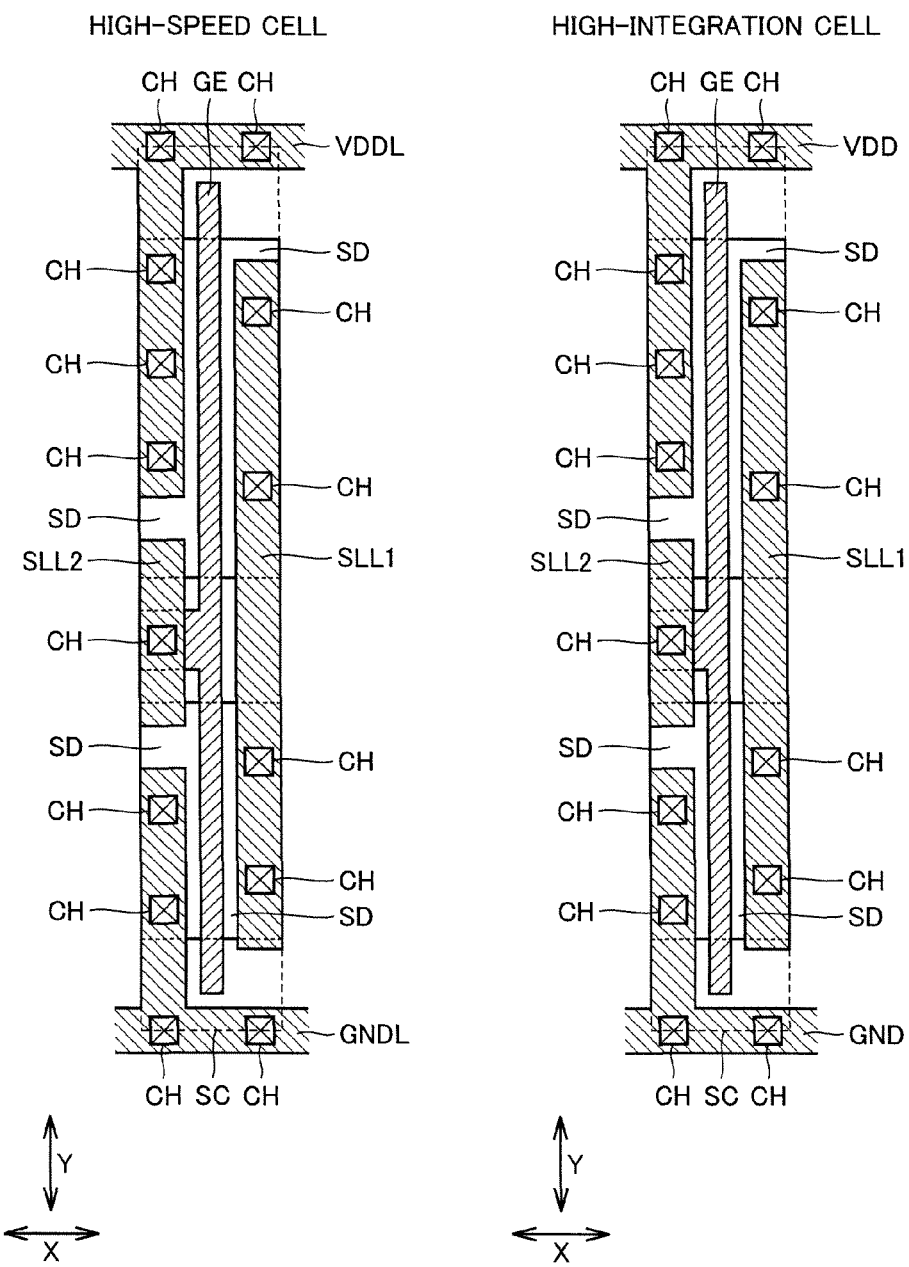
FIG. 19 is a schematic plan view showing the plan layout configuration of a high-speed cell formed in high-integration priority logic region HIL and a high-integration cell formed in high-performance priority logic region HRL, and mainly shows the polysilicon layers and the first metal layers formed thereabove.
Figure 20:
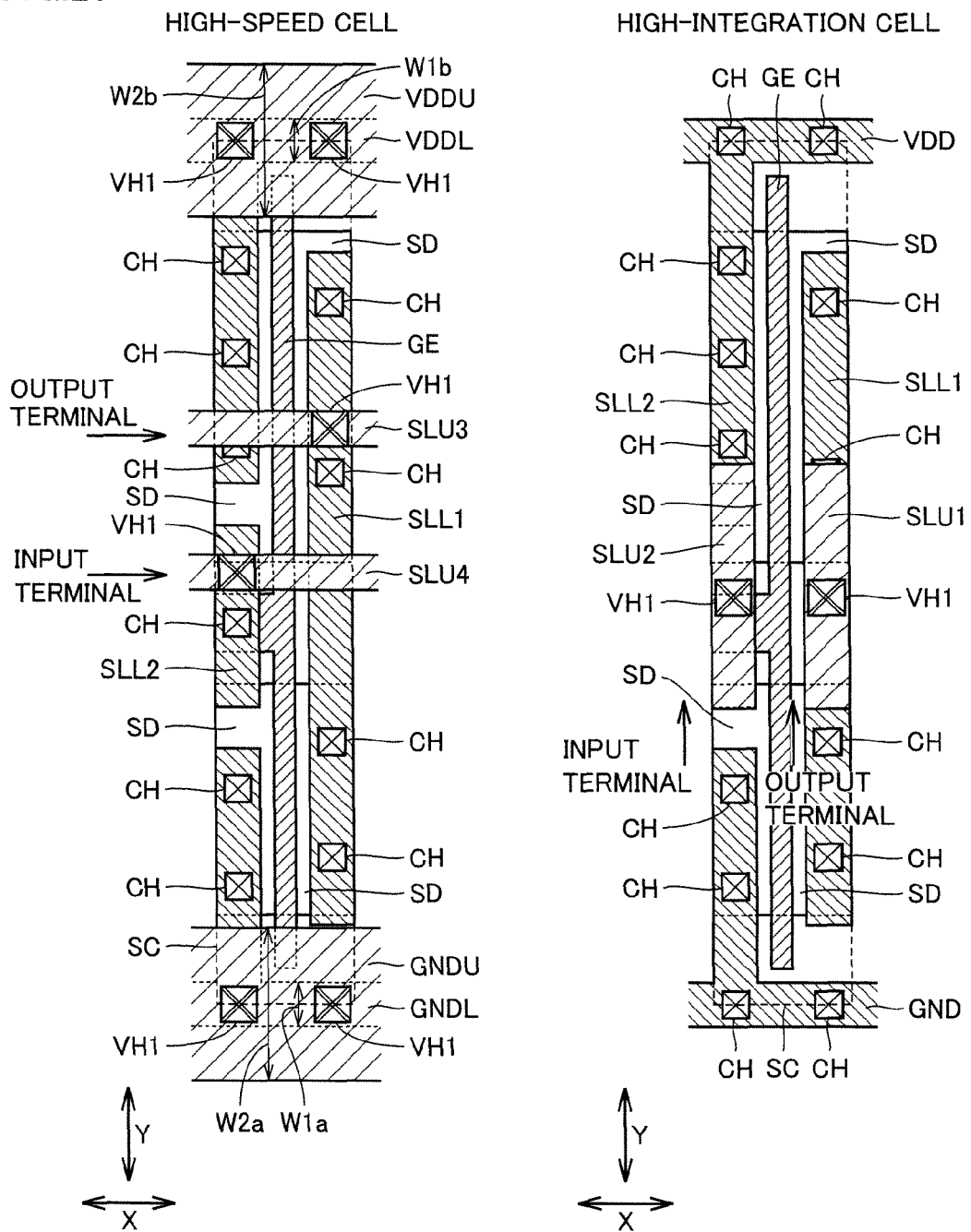
FIG. 20 is a schematic plan view showing the plan layout configuration of a high-speed cell formed in high-integration priority logic region HIL and a high-integration cell formed in high-performance priority logic region HRL, and mainly shows the first metal layers and the second metal layers formed thereabove.

FIG. 18 shows diffusion regions and isolation regions formed in a semiconductor substrate and polysilicon layers such as gate electrode layers formed on the semiconductor substrate. FIG. 19 mainly shows the polysilicon layers mentioned above and first metal layers formed thereon. FIG. 20 mainly shows the first metal layers mentioned above and second metal layers formed thereon.

With reference to FIG. 18, both a high-speed cell and a high-integration cell are each made of a CMOS inverter including a pMOS transistor PT and an nMOS transistor NT.

In both the high-speed cell and the high-integration cell, pMOS transistor PT includes a pair of p-type source/drain regions SD, a gate insulating film (not shown), and a gate electrode layer GE. Each of the pair of p-type source/drain regions SD is formed on the surface of semiconductor substrate SUB. Gate electrode layer GE is formed on the surface of semiconductor substrate SUB sandwiched by the pair of p-type source/drain regions SD with a gate insulating film interposed therebetween.

In both the high-speed cell and the high-integration cell, nMOS transistor NT includes a pair of p-type source/drain regions SD, a gate insulating film (not shown), and gate electrode layer GE. Each of the pair of n-type source/drain regions SD is formed on the surface of semiconductor substrate SUB. Gate electrode layer GE is formed on the surface of semiconductor substrate SUB sandwiched by the pair of n-type source/drain regions SD with a gate insulating film interposed therebetween.

In both the high-speed cell and the high-integration cell, gate electrode layer GE of pMOS transistor PT and gate electrode layer GE of nMOS transistor NT are united and electrically connected to each other.

In both the high-speed cell and the high-integration cell, an n+ region NIR is formed on the surface in semiconductor substrate SUB in such a manner as to extend in the X direction in the drawing along the boundary on the upper side in the Y direction in the drawing in a standard cell region. A p+ region PIR is formed on the surface in semiconductor substrate SUB in such a manner as to extend in the X direction in the drawing along the boundary on the lower side in the Y direction in the drawing in the standard cell region.

Here, the planar layout of the CMOS inverter in the high-speed cell is the same as that of the CMOS inverter in the high-integration cell. The planar layout of each of n+ region NIR and p+ region PIR in the high-speed cell is the same as that of each of n+ region NIR and p+ region PIR in the high-integration cell.

With reference to FIG. 19, formed on MOS transistor PT or NT is a patterned first metal layer with an interlayer insulating layer (not shown) interposed therebetween. This first metal layer includes lower layer interconnects GND or GNDL of the power supply line at the GND potential, lower layer interconnects VDD or VDDL of the power supply line at the VDD potential, and other signal lines SLL1 and SLL2.

Lower layer interconnect GNDL extends in the X direction in the drawing along the boundary on the lower side in the Y direction in the drawing in the standard cell region in a high-speed cell. This lower layer interconnect GNDL is electrically connected to underlying p+ region PIR through a plurality of contact holes CH. Lower layer interconnect GNDL is electrically connected to one of source/drain region SD of nMOS transistor NT through a plurality of contact holes CH.

Lower layer interconnect VDDL extends in the X direction in the drawing along the boundary on the upper side in the Y direction in the drawing in the standard cell region in the high-speed cell. This lower layer interconnect VDDL is electrically connected to underlying n+ region NIR through a plurality of contact holes CH. Lower layer interconnect VDDL is electrically connected to one of source/drain regions SD of pMOS transistor PT through a plurality of contact holes CH.

Signal line SLL1 is electrically connected to each of the other of source/drain regions SD of nMOS transistor NT and the other of source/drain region SD of pMOS transistor PT through contact holes CH. Signal line SLL2 is electrically connected to gate electrode layer GE through contact holes CH.

Here, the planar layout of each of lower layer interconnect GNDL and lower layer interconnect VDDL in the high-speed cell is the same as that of each of lower layer interconnect GND and lower layer interconnect VDD in the high-integration cell. The planar layout of signal line SLL1 and signal line SLL2 in the high-speed cell is the same as that of signal line SLL1 and signal line SLL2 in the high-integration cell.

With reference to FIG. 20, formed on the first metal layer is a patterned second metal layer with an interlayer insulating layer (not shown) interposed therebetween. This first metal layer includes upper layer interconnect GNDU of the power supply line at the GND potential, upper layer interconnect VDDU of the power supply line at the VDD potential, and other signal lines SLU1 to SLU4.

Upper layer interconnect GNDU extends in the X direction in the drawing along the boundary on the lower side in the Y direction in the drawing in the standard cell region in the high-speed cell. This upper layer interconnect GNDU is electrically connected to underlying lower layer interconnect GNDL through a plurality of via holes VH1. Upper layer interconnect GNDU has line width W2*a* larger than line width W1*a* of lower layer interconnect GNDL.

Upper layer interconnect VDDU extends in the X direction in the drawing along the boundary on the upper side in the Y direction in the drawing in the standard cell region in the high-speed cell. This upper layer interconnect VDDU is electrically connected to underlying lower layer interconnect VDDL through a plurality of via holes VH1. Upper layer interconnect VDDU has line width W2*b* larger than line width W1*b* of lower layer interconnect VDDL.

Each of signal lines SLU3 and SLU4 is formed in the standard cell in the high-speed cell. Each of these signal lines SLU3 and SLU4 extends in the X direction in the drawing (i.e., the same direction as upper layer interconnects GNDU and VDDU extend, as viewed from a plane) to run across the boundary in the standard cell region in the high-speed cell. Signal line SLU3 is electrically connected to signal line SLL1 through via hole VH1. Signal line SLU4 is electrically connected to signal line SLL2 through via hole VH1.

In the standard cell of the high-integration cell, each of signal lines SLU1 and SLU2 extends in the Y direction in the drawing (i.e., direction orthogonal to the direction in which lower layer interconnects GND and VDD extend, as viewed from a plane). Signal line SLU1 is electrically connected to signal line SLL1 through via hole VH1. Signal line SLU2 is electrically connected to signal line SLL2 through via hole VH1.

Note that each of signal lines SLU1 and SLU2 may extend in the Y direction in the drawing to run across the boundary in the standard cell region in the high-integration cell.

Next, a plurality of standard cells in each of high-integration priority logic region HIL and high-performance priority logic region HRL will be described.

Figure 21:
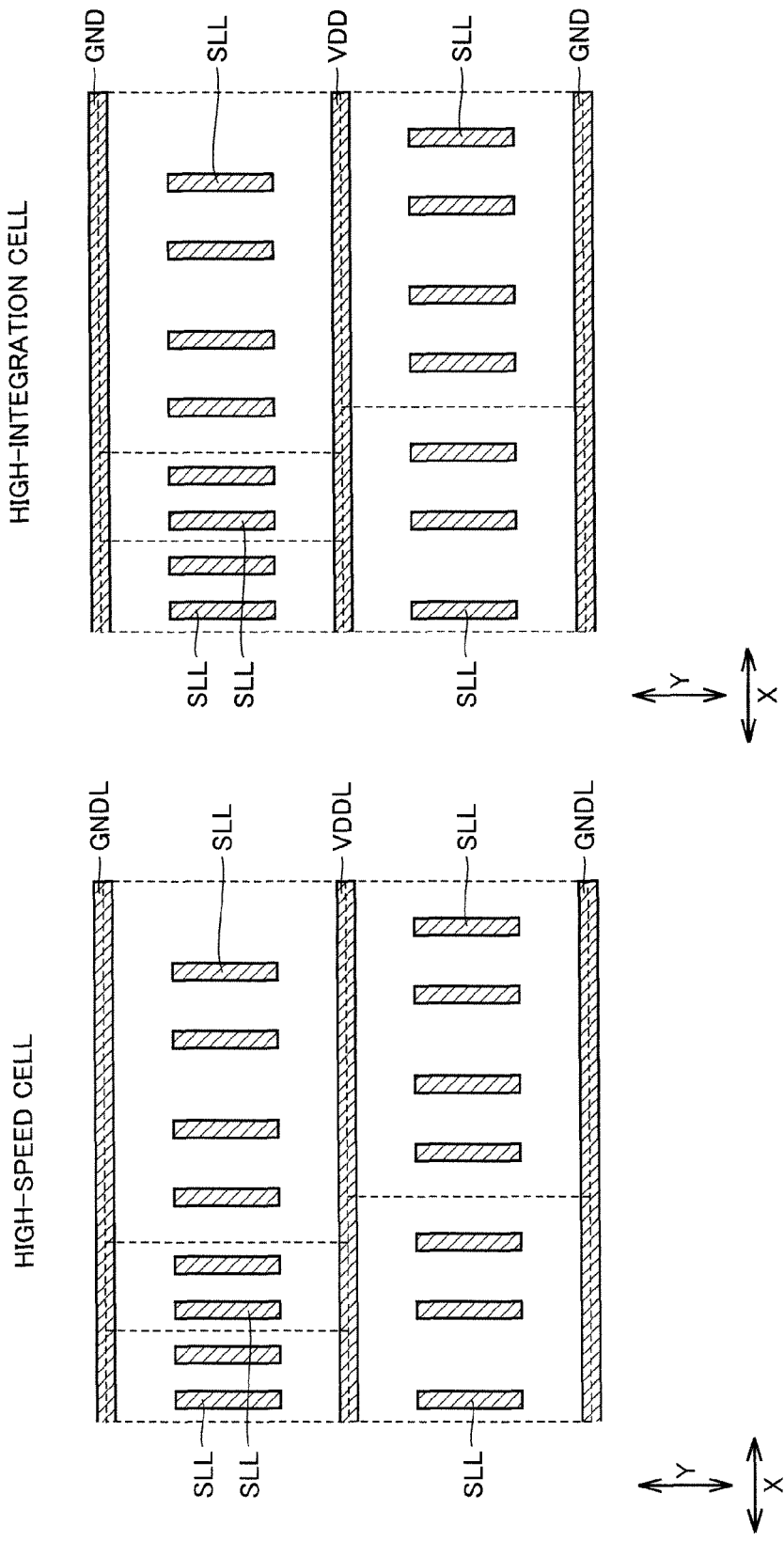
FIG. 21 is a schematic plan view showing the plan layout configuration in a case where a plurality of standard cells in high-integration priority logic region HIL are formed as high-speed cells and a plurality of standard cells in high-performance priority logic region HRL are formed as high-integration cells, and shows the first metal layers.
Figure 22:
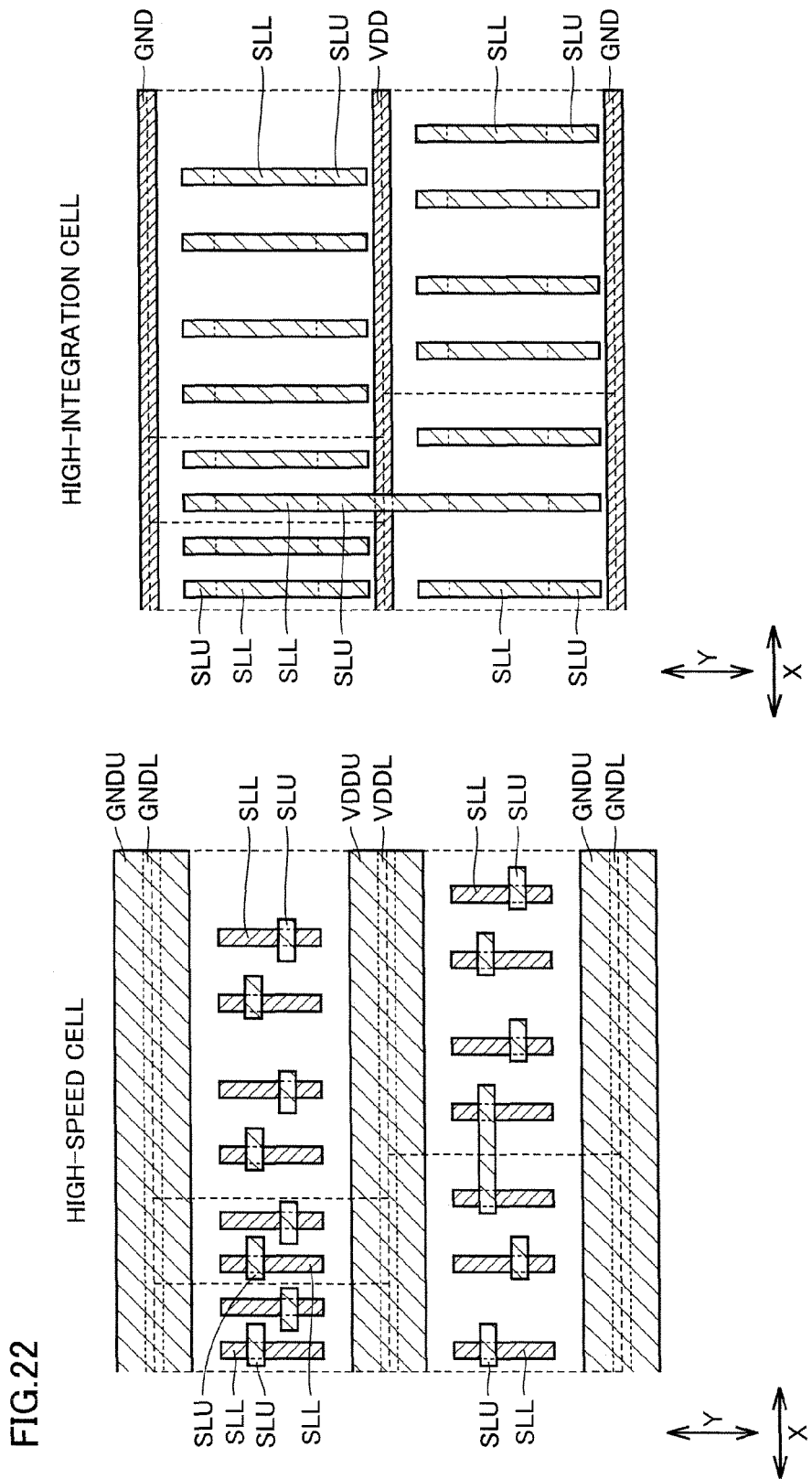
FIG. 22 is a schematic plan view showing, from lower to upper, the plan layout configuration in a case where a plurality of standard cells in high-integration priority logic region HIL are formed as high-speed cells, and a plurality of standard cells in high-performance priority logic region HRL are formed as high-integration cells, and shows the first metal layer and the second metal layer formed thereabove.
Figure 23:
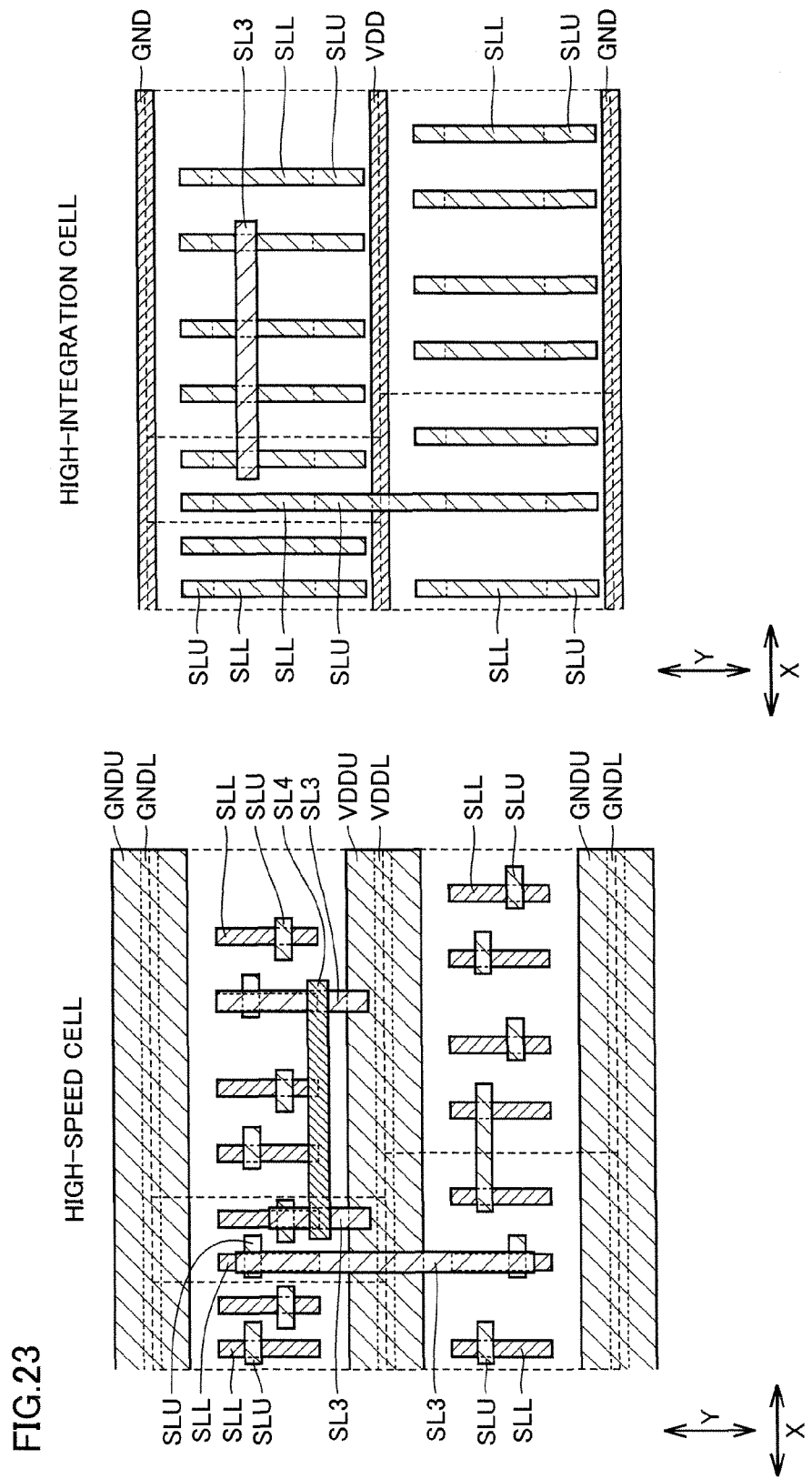
FIG. 23 is a schematic plan view showing, from lower to upper, the plan layout configuration in a case where a plurality of standard cells in high-integration priority logic region HIL are formed as high-speed cells, and a plurality of standard cells in high-performance priority logic region HRL are formed as high-integration cells, and shows the first and second metal layers, a third metal layer formed thereabove, and a fourth metal layer formed further above the foregoing layers.

FIG. 21 shows the first metal layer. FIG. 22 shows the first metal layer and the second metal layer formed thereabove. FIG. 23 shows the first and second metal layers, a third metal layer formed thereabove, and a fourth metal layer formed further above the foregoing layers.

With reference to FIG. 21, the high-speed cell and the high-integration cell have the same planar layout configurations of the first metal layer and layers positioned lower than the first metal layer, which is in the same manner in a case of a plurality of standard cells as in a case of a single standard cell.

With reference to FIGS. 22 and 23, the high-speed cell and the high-integration cell differ from each other in planar layout configurations of the second metal layer and layers positioned upper than that (e.g., the third and fourth layers), which is in the same manner in a case of a plurality of standard cells as in a case of a single standard cell.

In the high-speed cell, upper layer interconnects GNDU and VDDU made of the second metal layer are formed with a smaller line width than that of lower layer interconnects GNDL and VDDL in such a manner as to extend along the boundary of the standard cell. Signal lines SLU made of the second metal layer extend in the same direction as that in which lower layer interconnects GNDL and VDDL extend.

On the other hand, in the high-integration cell, upper layer interconnects GNDU and VDDU made of the second metal layer are not provided. Signal lines SLU made of the second metal layer extend in a direction orthogonal to the direction in which lower layer interconnects GNDL and VDDL extend.

In the high-speed cell, as shown in FIG. 22, upper layer interconnects GNDU and VDDU made of the second metal layer are provided. Accordingly, signal lines SLU made of the second metal layer cannot extend in such a manner as to stride the boundary between the standard cell on the upper side and the standard cell on the lower side in the Y direction in the drawing. Thus, in the high-speed cell, as shown in FIG. 23, without the use of the third metal layer and the fourth metal layer, elements in the standard cells adjacent to each other in the Y direction in the drawing cannot be electrically connected to each other, and elements in the standard cells adjacent to each other in the X direction in the drawing also cannot be electrically connected to each other.

In other words, signal line SL3 made of the third metal layer is arranged in such a manner that it strides the boundary between upper and lower standard cells in the Y direction in the drawing, enabling elements in the standard cells adjacent to each other in the Y direction in the drawing to be electrically connected to each other. Signal line SL4 made of the fourth metal layer is also arranged in such a manner that it strides the boundary between right and left standard cells in the X direction in the drawing, enabling elements in the standard cells adjacent to each other in the X direction in the drawing to be electrically connected to each other.

On the other hand, in the high-integration cell, as shown in FIG. 22, upper layer interconnects GNDU and VDDU made of the second metal layer are not provided. Accordingly, signal line SLU made of the second metal layer can extend in such a manner as to stride the boundary between the standard cells vertically adjacent to each other in the Y direction in the drawing. Thus, in the high-integration cell, as shown in FIG. 23, without the use of the fourth metal layer, elements in the standard cells adjacent to each other in the Y direction in the drawing can be electrically connected to each other, and elements in the standard cells adjacent to each other in the X direction in the drawing also can be electrically connected to each other by the use of the second metal layer and the third metal layer.

In other words, signal line SLU made of the second metal layer is arranged in such a manner that it strides the boundary between upper and lower standard cells in the Y direction in the drawing, enabling elements in the standard cells adjacent to each other in the Y direction in the drawing to be electrically connected to each other. Signal line SL3 made of the third metal layer is arranged in such a manner that it strides the boundary between right and left standard cells in the X direction in the drawing, enabling elements in the standard cells adjacent to each other in the X direction in the drawing to be electrically connected to each other.

According to the present embodiment, in the standard cell of the high-speed cell, the power supply line at the GND potential is separated into lower layer interconnects GNDL and upper layer interconnects GNDU, and the power supply line at the VDD potential is separated into lower layer interconnect VDDL and upper layer interconnect VDDU. This case has an increased number of electric current paths as compared to a case of the power supply line being a single layer, and therefore allows higher speeds to be achieved. The number of electric current paths can be increased without increasing the line width of the power supply line, thus allowing higher integration to be achieved.

Line widths W2$a$ and W2$b$ of upper layer interconnects GNDU and VDDU are larger than line widths W1$a$ and W1$b$ of lower layer interconnects GNDL and VDDL, respectively, thus allowing the resistance value of the power supply line to be reduced.

Line widths W1$a$ and W1$b$ of lower layer interconnects GNDL and VDDL are smaller than line widths W2$a$ and W2$b$ of upper layer interconnects GNDU and VDDU, respectively, thus increasing an open space for arranging interconnects accordingly. Therefore, it becomes easy to arrange other interconnects in the same layer as that of the lower layer interconnects, improving the freedom in the planar layout of other interconnects.

Lower layer interconnects GNDL and VDDL and upper layer interconnects GNDU and VDDU each extend along the boundary of the standard cell. Accordingly, standard cells adjacent to each other can share these power supply lines. As a result of this, there is no need for these power supply lines to be formed independently in each standard cell, thereby allowing higher integration to be achieved.

From the above, a semiconductor device can be obtained that can achieve both higher speeds and higher integration. According to the embodiment, the planar layout of the first metal layer and layers positioned lower than the first metal layer is common between the high-speed cell and the high-integration cell. This facilitates the design of the planar layout. The P&R (automatic interconnect arrangement) flow in this design is as follows.

First, the planar layout of the first metal layer and layers positioned lower than the first metal layer is registered, in a standard cell library, as the common layout between the high-speed cell and the high-integration cell. On the other hand, a technology file is prepared in which via holes for use in terminal access in the high-speed cell and via holes for use in terminal access in the high-integration cell have been registered.

In the P&R flow, the high-speed cell and the high-integration cell are designed by addition of registered data of the P&R technology file from the common layout registered in the standard cell library.

In this way, the planar layout of the first metal layer and layers positioned lower than the first metal layer is common between the high-speed cell and the high-integration cell, and therefore there is no need for preparing a plurality of libraries of different cell configurations in the high-speed cell and the high-integration cell, thus facilitating the design.

Only with the change in the pattern of the second metal layer and layers positioned upper than that, high-speed cells are formed in high-integration priority logic region HIL and high-integration cells are formed in high-performance priority logic region HRL. As a result, the plane pattern of the second metal layer and layers positioned lower than the second metal layer can be the same between the high-speed cell and the high-integration cell. This can facilitate the pattern design of a semiconductor device in which both higher speeds and higher integration can be achieved.

In the present embodiment, high-speed cells are formed in high-integration priority logic region HIL and high-integration cells are formed in high-performance priority logic region HRL. In this high-speed cell, power supply lines (VDD interconnect and GND interconnect) are distributed into lower layer interconnects GNDL and VDDL and upper layer interconnects GNDU and VDDU. This causes an increased number of electric current paths as compared to a case of the power supply line being a single layer, and therefore allows higher speeds to be achieved.

In the high-integration cell, the power supply lines (VDD interconnect and GND interconnect) are made of a single layer, allowing high integration in the lamination direction. The power supply lines (VDD interconnect and GND interconnect) are made of a single layer, allowing signal lines made of the second metal layer to be arranged more freely than those in the high-speed cell. For example, as shown in FIG. 20, signal lines made of the second metal layer can extend in a direction orthogonal to lower layer interconnects GND and VDD, as viewed from a plane to run across the boundary of a standard cell. This results in higher freedom in the planar layout of signal lines made of the second metal layer.

(Sixth Embodiment)

With reference to FIG. 24, the configuration of the present embodiment differs form that of the fifth embodiment shown in FIGS. 21 to 23 in having a configuration in which the planar layout of the high-integration cell is rotated through 90 degrees relative to the planar layout of the high-speed cell.

This allows the directions in which signal line SL3 made of the third metal layer extends to be the same both in the high-speed cell and the high-integration cell.

Note that the configuration of the present embodiment other than the above point is substantially the same as that of the fifth embodiment shown in FIGS. 21 and 23, and therefore elements of the present embodiment identical to those in the fifth embodiment are indicated by the same reference characters, and the same description is not repeated.

According to the present embodiment, the directions in which signal line SL3 made of the third metal layer extends can be made the same both in the high-speed cell and in the high-integration, thus facilitating the interconnect design. This allows improvement in integration and reduction in convergence time of automatic wiring to be achieved.

It should be noted that, in the foregoing first to sixth embodiments, the planar layout configuration of a function element and interconnects in standard cells adjacent to each other may have line symmetry about the boundary line of the standard cells. In particular, between a plurality of kinds of standard cells, ground interconnects and power supply interconnects provided on the standard cell boundary have a configuration of line symmetry at the cell boundary. This allows the ground interconnects and the power supply interconnects to be made common to standard cells positioned above and below the cell boundary, facilitating the layout reduction and the cell arrangement design in P&R (automatic interconnect arrangement).

It should be noted that although elements having a CMOS inverter, an NAND and the like have been described as function elements in the foregoing fourth to sixth embodiments, the present invention is not limited to this and may be applied to CMOS NAND and NOR circuits, flip-flop circuits, try state buffer circuits and other function elements.

The invention may be applied particularly advantageously to semiconductor devices having a plurality of aligned standard cells.

The embodiments disclosed herein are to be considered in all respects illustrative and not restrictive. The scope of the invention is indicated by the appended claims rather than by the foregoing description, and all variations that come within the meaning and range of equivalency of the claims are intended to be embraced therein.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor device having a plurality of aligned standard cells, comprising:
   a first power supply portion and a second power supply portion included by the plurality of aligned standard cells in common,
   wherein a first standard cell as one of said aligned standard cells is a function element,
   wherein the first standard cell includes a first transistor and a signal line,
   wherein the first power supply portion formed in the first standard cell includes a first power supply line and a second power supply line,
   wherein the first power supply line extends along a first boundary of the aligned standard cells which are adjacent to each other and is arranged on the first boundary,
   wherein the second power supply portion extends along a second boundary of the aligned standard cells which are adjacent to each other and is arranged on the second boundary,
   wherein the second power supply line is electrically connected to a portion of the first power supply line and is electrically connected to a source terminal of the first transistor,
   wherein a first power supply voltage is supplied to the first power supply portion, and a second power supply voltage which is higher than the first power supply voltage is supplied to the second power supply portion, and
   wherein a portion of the signal line that extends along a same direction as the first boundary is entirely between an edge of the first power supply line and an edge of the second power supply line, and the first power supply line covers at least a part of the signal line and at least a part of the second power supply line, as viewed from a plane.

2. The semiconductor device according to claim 1, wherein a first portion of the second power supply portion, the second power supply line and the signal line are formed in a first wiring layer, and a second portion of the second power supply portion and the first power supply line are formed in a second wiring layer formed on the first wiring layer.

3. The semiconductor device according to claim 1, wherein the first power supply portion includes the second power supply line which is formed below the first power supply line, extends along the first boundary,
   wherein the second power supply portion includes an upper power supply line and an under power supply line, each of the upper and under power supply lines extends along the second boundary,
   wherein the under power supply line and the second power supply line are formed in a first wiring layer, and the first power supply line and the upper power supply line are formed in a second wiring layer formed on the first wiring layer, and
   wherein the first power supply line and the second power supply line are connected to each other in the first standard cell, and the upper and the under power supply lines are connected to each other in the first standard cell.

4. The semiconductor device according to claim 1, wherein the first power supply portion includes a third power supply line which is formed below the first power supply line, extends along the first boundary,
   wherein the second power supply portion includes an upper power supply line and an under power supply line, each of the upper and under power supply lines extends along the second boundary,
   wherein the under power supply line and the third power supply line are formed in a first wiring layer, and the first power supply line and the upper power supply line are formed in a second wiring layer formed on the first wiring layer, and wherein the first power supply line and the second power supply line are connected to each other in a second standard cell, the upper and the under power supply lines are connected in each other in the second standard cell, and the second standard cell as one of the aligned standard cells is free of said function element.

5. The semiconductor device according to claim 1, wherein:

the first power supply portion includes the second power supply line which is formed below the first power supply line, extends along the first boundary, wherein the second power supply portion includes an upper power supply line and an under power supply line, each of the upper and under power supply lines extends along the second boundary, wherein the under power supply line and the second power supply line are formed in a first wiring layer, and the first power supply line and the upper power supply line are formed in a second wiring layer formed on the first wiring layer, and wherein a first width of the first power supply line is broader than a second width of the second power supply line, and a third width of the upper power supply line is broader than a fourth width of the under power supply line.

* * * * *

UNITED STATES PATENT AND TRADEMARK OFFICE
CERTIFICATE OF CORRECTION

| | | |
|---|---|---|
| PATENT NO. | : 8,264,011 B2 | Page 1 of 1 |
| APPLICATION NO. | : 13/248965 | |
| DATED | : September 11, 2012 | |
| INVENTOR(S) | : Nobuhiro Tsuda | |

It is certified that error appears in the above-identified patent and that said Letters Patent is hereby corrected as shown below:

IN THE CLAIMS:

Column 26, Claim 4, line 59, --a third-- should be corrected to read the second

Column 26, Claim 4, line 66, --third-- should be corrected to read second

Column 27, Claim 4, line 7, --in-- first occurrence, should be corrected to read to Signed and Sealed this
Eighth Day of April, 2014

Michelle K. Lee
*Deputy Director of the United States Patent and Trademark Office*